US005777778A

United States Patent [19]
Yao

[11] Patent Number: 5,777,778
[45] Date of Patent: Jul. 7, 1998

[54] MULTI-LOOP OPTO-ELECTRONIC MICROWAVE OSCILLATOR WITH A WIDE TUNING RANGE

[75] Inventor: Xiaotian S. Yao, Diamond Bar, Calif.

[73] Assignee: California Institute of Technology, Pasadena, Calif.

[21] Appl. No.: 693,798

[22] Filed: Aug. 1, 1996

Related U.S. Application Data

[60] Provisional application No. 60/010,472, Jan. 23, 1996.
[51] Int. Cl.⁶ .................................................. G02F 1/03
[52] U.S. Cl. ........................ 359/245; 359/184; 359/181; 359/187
[58] Field of Search .................................. 359/184, 245, 359/181, 187

[56] References Cited

U.S. PATENT DOCUMENTS

| | | |
|---|---|---|
| 3,569,715 | 3/1971 | Horning . |
| 4,700,150 | 10/1987 | Hall et al. . |
| 5,343,324 | 8/1994 | Le et al. . |
| 5,379,309 | 1/1995 | Logan, Jr. . |
| 5,400,417 | 3/1995 | Allie et al. . |

OTHER PUBLICATIONS

Yao et al. Optoelectronic Oscillator for Photonic Systems, 7–1996, *IEEE Journal of Quantum Electronics*, vol. 32, no. 7.
Yao et al. Optoelectronic Microwave Oscillator, 8–1996, *J. Opt. Soc. Am. B.*, vol. 13, No. 8.
Yao et al. High Frequency Optical Subcarrier Generator, 9–1994, *Electronics Letters*, vol. 30, No. 18.
A. Neyer and E. Voges, Hybrid Electro-Optical Multivibrator Operating By Finite Feedback Delay, Jan. 21, 1982, *Electronical Letters*.
H.M. Gibs, F.A. Hopf, D.L. Kaplan, M.W. Derstine, R.L. Shoemaker, Periodic Oscillations and Chaos in Optical Bistability: Possible Guided-Wave All-Optical Square-Wave Oscillators, 1981, *SPIE* vol. 317.
A. Neyer and E. Voges, High–Frequency Electro–Optic Oscillator Using an Integrated Interferometer, Jan. 1, 1982, *Appl. Phys. Lett.* 40(1).
A. Neyer and E. Voges, Nonlinear Electrooptic Oscillator Using and integrated Interferometer, May 1, 1981 *Optics Communications* vol. 37, No. 3.
A. Neyer and E. Voges, Dynamics of Electrooptic Bistable Devices with Delayed Feedback, Dec. 1982, *IEEE Journal of Quantum Electronics*, vol. QE–18, No. 12.
H.F. Schlaak and R.Th. Kersten, Integrated Optical Oscillators and Their Applications to Optical Communication Systems, *Optics Communications* vol. 36, No. 3.
Tahito Aida and Peter Davis, Oscillation Modes of Laser Diode Pumped Hybrid Bistable System with Large Delay and Application to Dynamical Memory, Mar. 1992, *IEEE Journal of Quantum Electronics*, vol. 28, No. 3.

(List continued on next page.)

*Primary Examiner*—Frank G. Font
*Assistant Examiner*—Reginald A. Ratiff
*Attorney, Agent, or Firm*—Fish & Richardson P.C.

[57] ABSTRACT

A versatile photonic radio frequency (RF) oscillator employs multiple feedback loops of different delay times, including at least one optical feedback loop, to generate RF signals with ultra low phase noise, narrow spectral linewidth, and a continuous wide tuning range of high resolution. Specifically, an electro-optical modulator and a long optical fiber loop are implemented in one dual-loop system. In addition, a light beam from a light source can be directly modulated by using feedback signals from multi feedback loops to alter the electrical control signal to the light source. Furthermore, the disclosed system supports both electrical and optical RF outputs. External optical injection and electrical injection can be implemented.

87 Claims, 13 Drawing Sheets

OTHER PUBLICATIONS

X. Steve Yao and Lute Maleki, Optoelectronic Microwave Oscillator, Aug. 1996, *J. Opt. Soc. Am. B*/vol. 13, No. 8.

X. Steve Yao and George Lutes, A High–Speed Photonic Clock and Carrier Recovery Device, May 1996, *IEEE Photonics Technology Letters*, vol. 8, No. 5.

X. Steve Yao and Lute Maleki, Converting Light Into Spectrally Pure Microwave Oscillation, Apr. 1, 1996, *Optics Letters* vol. 21, No. 7.

X. Steve Yao and Lute Maleki, Optoelectronic Oscillator for Photonic Systems, Apr. 7, 1996, *IEEE Journal of Quantum Electronics*, vol. 32, No. 7.

X.S. Yao and L. Maleki, High Frequency Optical Subcarrier Generator, Apr. 21, 1994, *Electronics Letters Online* No.: 19941033.

Smith, Mode Selection in Lasers, Apr. 1972, *Proceedings in the IEEE*, vol. 60, No. 4.

Yao et al., A High–Speed Photonic Clock and Carrier Recovery Device, May 1996, *IEEE Photonics Technology Letters*, vol. 8, No. 5.

Yao et al., Converting Light into Spectrally Pure Microwave Oscillation, Apr. 1996, *Optics Letters*, vol. 21, No. 7.

Aida et al, Oscillation Mode Selection Using Bifurcation of Chaotic Mode Transitions in a Nonlinear Ring Resonator, Dec. 1994, *IEEE Transactions on Quantum Electronics*, vol. 30, No. 12.

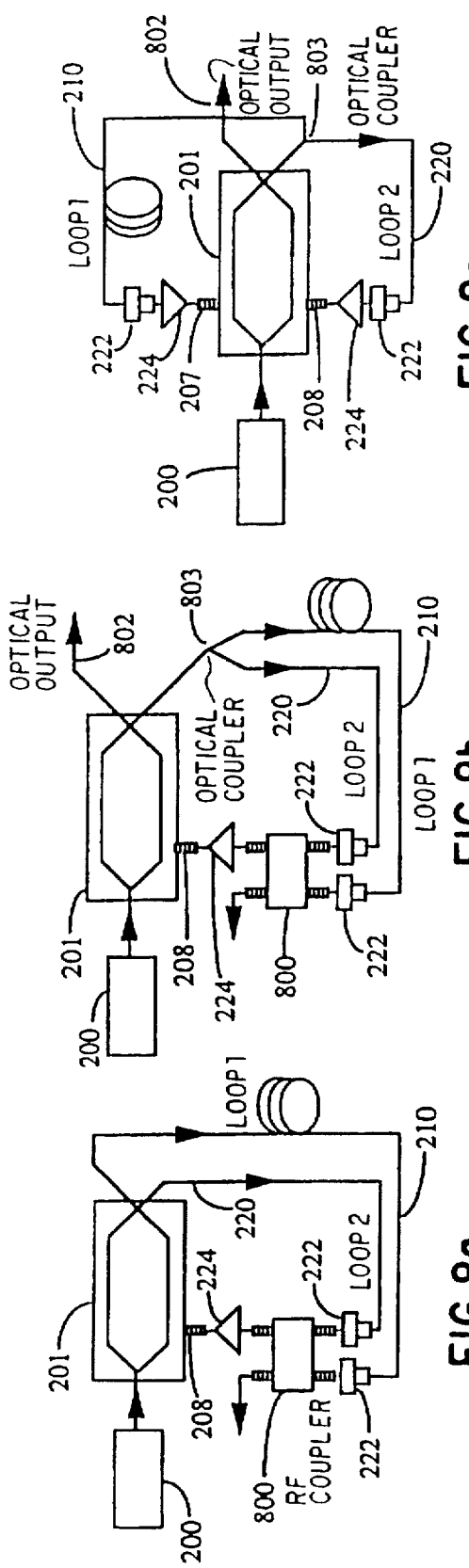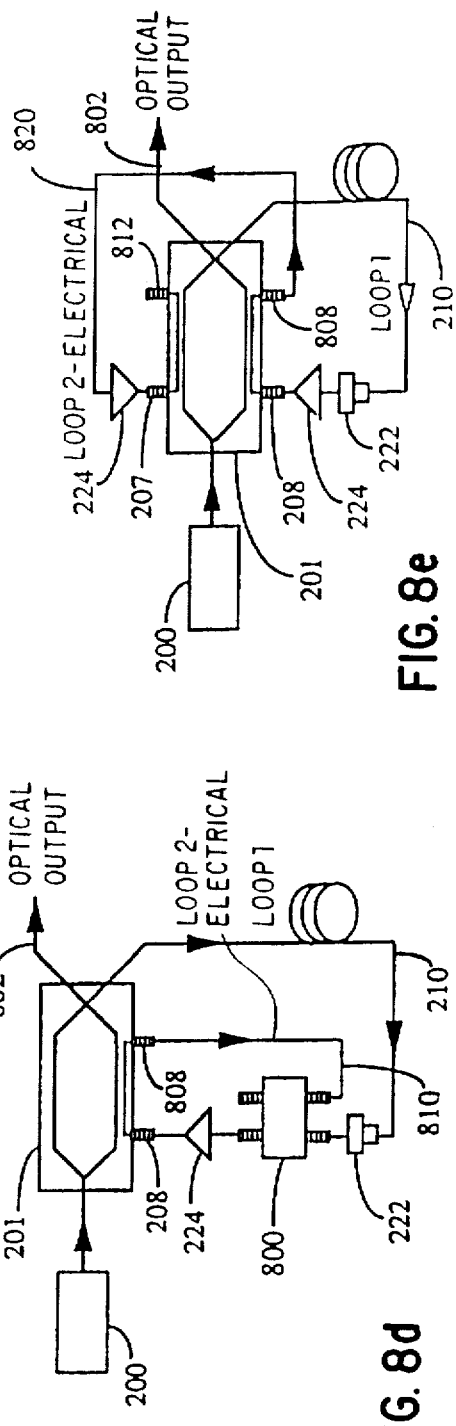

MULTI-LOOP OPTO-ELECTRONIC MICROWAVE OSCILLATOR WITH A WIDE TUNING RANGE

This application claims the benefit of U.S. Provisional Application Ser. No. 60/010,472, filed on Jan. 23, 1996.

ORIGIN OF INVENTION

The invention described herein was made in the performance of work under a NASA contract, and is subject to the provisions of Public Law 96-517 (35 U.S.C. 202) in which the Contractor has elected to retain title.

FIELD OF INVENTION

The present invention relates to radio frequency and microwave oscillators and specifically to a continuously tunable photonic microwave oscillator based on multiple electro-optical feedback loops.

BACKGROUND AND SUMMARY

Radio frequency (RF) oscillators are widely used for generating, tracking, cleaning, amplifying, and distributing RF carriers. In particular, voltage-controlled RF oscillators with phase-locked loops are used for clock recovery, carrier recovery, signal modulation and demodulation, and frequency synthesizing. RF oscillators are important to communication, broadcasting, and receiving systems in the radio frequency spectral range. Conventional RF oscillators include electronic oscillators using solid-state electronic components.

Many conventional devices, including many computers and such, transfer information by flow of electrons. Photonic technology, in contrast, uses photons to transfer information. Photonic technology offers a number of advantages including: low loss, light weight, high carrier frequency, high security, remote capability, and immunity to electromagnetic interference. Photonic devices and systems have been widely used in a variety of applications in recent years.

For example, rapid advances in photonic fields including diode laser systems, photodetectors, electro-optical light modulators, and optical fiber systems allow implementation of photonic technology in traditional RF systems for many applications, with enhanced performance. This trend presents significant advantages for photonic RF systems and greatly expands the horizon of photonic applications. For example, optical waves may be used as carrier to transport the information contained in RF signals through optical fibers to remote locations in a photonic RF system. This also allows some of the RF signal processing functions such as signal mixing, antenna beam steering, and signal filtering, to be accomplished optically.

One key area in RF technology is RF oscillators which have a wide range of applications including time standards and telecommunications. There are a variety of RF oscillators including mechanical oscillators (e.g., a quartz resonator), electromagnetic oscillators (e.g., LC oscillator), and atomic oscillators (e.g., masers and lasers). To achieve low noise and long-term stability, hybrid oscillators that combine the merits of different oscillators have been developed for various applications. Electronic RF oscillators based on vacuum tubes or solid-state transistors are among the most commonly used RF oscillators in electronic devices and systems.

The stabilization of the oscillation frequency in an oscillator is also important. Electronic RF oscillators are often stabilized with other type of oscillators for long-term stability. For example, electromagnetic oscillators of dielectric cavities and mechanical resonators made of quartz crystals are often used for this purpose. In particular, quartz crystal resonators can achieve a high cavity Q factor at room temperatures. Few other oscillators can do this. However, a quartz crystal resonator only have a few resonant modes at low frequencies (e.g., less than 100 MHz) and thereby the frequency tuning range of a quartz crystal resonator is limited. Thus, such a quartz crystal resonator has limited use in many applications that require large tunability and high frequency.

Moreover, many traditional RF oscillators cannot meet the requirements of an application that involves RF signals in both the optical and electrical domains. An ideal oscillator for photonic RF systems should be able to generate RF signals in both the optical and electrical domains. It may also be possible to synchronize or control the oscillator by both electrical and optical references or signals.

Several photonic techniques for generating high-frequency RF signals have been developed. For example, one way of generating a high frequency RF signal in the optical domain is to modulate a diode laser or an external electro-optical (E/O) modulator using a high-frequency stable electrical signal from a local oscillator. Such a local oscillator signal is generally obtained by multiplying a low frequency reference (e.g. quartz oscillator) to a desired high frequency (e.g., 32 GHz), with several stages of multipliers and amplifiers. Consequently, the overall system is usually bulky, complicated, inefficient, and costly. An other way to generate photonic RF carriers obtains a beat signal by mixing two lasers operating at different optical frequencies. This technique, however, usually produces a wide bandwidth in the generated RF signal and the frequency stability of the beat signal can be poor due to the frequency drift of the two lasers.

The inventor of the present invention recognized the need for a long-term stable photonic RF oscillator with low noise. The inventor disclosed an opto-electronic oscillator ("OEO") in U.S. patent application Ser. No. 08/510,064. An OEO is a photonic oscillator that converts continuous photon energy from a laser into RF and microwave signals and achieves oscillation via an optical fiber feedback loop.

FIG. 1 is a schematic of one example of OEO disclosed in U.S. patent application Ser. No. 08/510,064. A light source 100 emits a light beam 102 that impinges on an electro-optic (E/O) modulator 110 which modulates the light passing therethrough. An input coupler 111 splits the beam 102 into two channels 112 and 114 which undergo different phase or polarization modulation. A bias port 113 is for offsetting the modulation via an external source. A proper bias can be critical for proper operation of the OEO. The light modulation is dependent on both the electrical voltage bias at the bias port 113 and the driving voltage from a RF driving port 115. The latter causes the light modulation to oscillate at a RF frequency. An output coupler 116 recombines the light from the modulated two channels 112 and 114 to produce a RF modulated light signal through coherent interference. The output coupler 116 sends one portion of the coupled output of the modulator 110 as an optical output 117 and another portion as a feedback into optical fiber loop 118.

A photodetector 122 measures the intensity of the output light 121 from the fiber loop 108. A RF amplifier 130 sends the amplified signal from the photodetector 122 back to the RF driving port 115 of the E/O modulator 110 through a RF filter 150, thus forming a feedback loop.

In general, many modes can oscillate simultaneously in the single-loop OEO as long as the loop gain exceeds the loop loss. A RF filter 150 is included in the feedback loop to achieve single mode oscillation by suppressing other oscillation modes. The RF filter is also used for coarse tuning of the oscillation frequency. Additional optical or RF delay elements can be inserted in the feedback loop for coarse tuning. Frequency tuning can also be achieved by biasing at the bias port 113 and the voltage input at the RF driving port 112. A fiber stretcher 119 in the fiber loop 108 is used to adjust the phase of the feedback loop by changing the loop length. This allows a convenient control of oscillation and fine frequency tuning of the oscillation. The phase noise in this single-loop OEO can be significantly reduced as the fiber loop 108 increases.

An optical coupler 120 is used at the photodetector 122 to couple an external optical injection 124 into the feedback loop. This allows the OEO to operate at an optical injection lock mode. A RF coupler 140, connected to the output of the RF amplifier 130, allows coupling an external RF signal 141 to the E/O modulator for external RF injection lock as well as an electrical output 142. The OEO in FIG. 1 is a hybrid oscillator since it has both electrical and optical outputs and inputs.

The single-loop OEO shown in FIG. 1 meets many requirements for photonic RF systems and yet is well suited for conventional RF applications. This photonic RF oscillator is capable of generating stable RF signals at high frequencies in both electrical and optical domain. The optical signal and the electrical signal are locked together in the feedback loop. If either signal changes, that change is accommodated by the feedback loop. This OEO can be implemented for many applications including phase-locked loop in photonic systems, high-frequency reference regeneration and distribution, carrier recovery, clock recovery, high-gain frequency multiplication, and generation of highly stable photonic mm-wave references. The diversity and high performance of the OEO system are rarely found in other RF oscillators.

A long feedback loop 118 has the advantage of low phase noise. However, for a long fiber feedback loop, the mode spacing is small in a single-loop OEO. Therefore, the bandwidth of the RF filter has to be very narrow in order to discriminate one mode from an adjacent mode and to sustain a single-mode operation. For example, the mode spacing of a OEO is about 200 KHZ if the fiber loop length is 1 Km. A single mode oscillation would require a RF filter to have a bandwidth to the order of a few hundred KHz.

A RF filter with a bandwidth of several hundred KHz at 10 GHZ can be difficult to obtain. Clearly, an alternative mode suppressing technique is desirable for a single-loop OEO with a feedback loop in the order of km or longer.

Another limitation of using a narrow band RF filter in the single-loop OEO is that the oscillator's tunability within the bandwidth can be severely limited.

Moreover, to further suppress the phase noise present in the OEO, the fiber feedback loop needs to be increased, which certainly presents a technical difficulty to achieve a single-mode operation in a single-loop OEO using a RF filter.

In recognition of the need for a wide range of tunability in photonic RF oscillator, the inventor improves the above-described OEO by implementing multiple feedback loops. Specifically, a long fiber feedback loop is incorporated in the multiloop OEO disclosed herein to achieve RF and microwave oscillations. The ultra-low phase noise and a wide range of frequency tunability of the multiloop OEO of the present invention are superior than many other oscillators including the single-loop OEO. The multiloop OEO presents significant advantages and improvements over the singe-loop OEO by employing multiple optical feedback loops with different delay lengths.

One aspect of the present invention is the significantly lower noise and very high stability that are rarely obtainable in an electronic oscillator and many other oscillators. In particular, the multiloop OEO is capable of achieving spectral purity that is much better than many crystal oscillators. The superior performance of the multiloop OEO results from the use of electro-optical and photonic devices which are generally characterized with high efficiency, high speed, and low dispersion in the RF and microwave spectral range. For instance, photodetectors capable of responding to signals of 110 GHz at nearly 90% quantum efficiency have been reported. Electro-optical modulators with a response as high as 75 GHz are now available. Commercial optical fibers with a low loss of 0.2 dB/km at 1550 nm allows long storage time of optical energy with negligible dispersive loss for intensity modulations at microwave frequencies.

Another aspect of the invention regards the low phase noise present in the oscillation. According to the disclosed system, the phase noise deceases quadratically with the loop delay time. Therefore, a long delay loop is incorporated in the multiloop feedback lines to minimize the phase noise to a level that is difficult to achieve for a single-loop OEO due to the reasons set forth above.

Still another aspect of the present invention is frequency tunability. The multiloop OEO has multiple feedback loops of different delay lengths. While the shortest feedback loop generates the modes of widest mode spacing in the frequency domain, the longest feedback loop produces modes of smallest mode spacing. The former dictates the continuous tuning range in the present invention and the latter determines the tuning resolution. Thus it is advantageous to have a large mode spacing by using one short feedback loop for a wide tuning range. According to the present invention, it is also beneficial to include one long feedback loop to obtain both a high tuning resolution and a low phase noise. By using at least one long delay loop and one short delay loop in a multiloop system, the present invention combines the advantages of both feedback loops to achieve a high-performance photonic RF system as disclosed herein.

For a tuning range beyond the mode spacing of the shortest feedback loop, the disclosed system uses a tunable RF filter in the feedback loop to shift the overall frequency spectral window of the multiloop OEO. Moreover, as the number of feedback loops increases, the bandwidth of the resonance peak of the oscillation decreases and this allows the stability and spectral purity to be improved.

Yet another unique aspect of the present invention is its versatile applications. The multiloop OEO is a hybrid oscillator in that both electrical and photonic components are used to achieve the oscillation. In particular, both electrical and optical inputs and outputs are supported in the present invention. This unique feature presents considerable advantages and flexibility to photonic applications wherein electronic and optical devices are integrated. In addition, the multiloop OEO of the present invention can be used as a frequency synthesizer.

These and other aspects of the present invention will now be discussed in detail with respect to the following accompanying figures, in which:

BRIEF DESCRIPTION OF THE DRAWINGS

FIG. 6b shows the phase noise measurements from the setup in FIG. 6a.

FIG. 8 includes FIGS. 8a, 8b, 8c, 8d, and 8e to illustrate various configurations of dual-loop OEO based on a feedback to an electro-optical modulator.

DETAILED DESCRIPTION OF THE INVENTION

The present invention describes a multiloop OEO to generate continuously tunable, highly stable, and spectrally pure oscillations in RF and microwave spectral range. In order to illustrate the operation principles of the multiloop technique of the present invention, a dual loop OEO will be described herein with details including a theoretical postulation thereof. The dual loop OEO is only a simplified example and should not be construed to limit the scope of the present invention.

As stated previously, a long feedback loop has small mode spacing between oscillation modes therein. This is desirable in increasing the frequency tuning resolution and obtaining high spectral purity. In addition, a long feedback loop reduces the phase noise in the system. However, an OEO with a single long feedback loop requires a RF filter of narrow bandwidth to achieve single-mode oscillation. This becomes difficult as the mode spacing becomes very small. A dual loop OEO in accordance with the present invention uses an additional short feedback loop, which is phase-locked to the long feedback loop, to achieve a large mode spacing produced by the short loop while maintaining the high tuning resolution, high spectral purity, and low phase noise of the long feedback loop.

Figure 2:
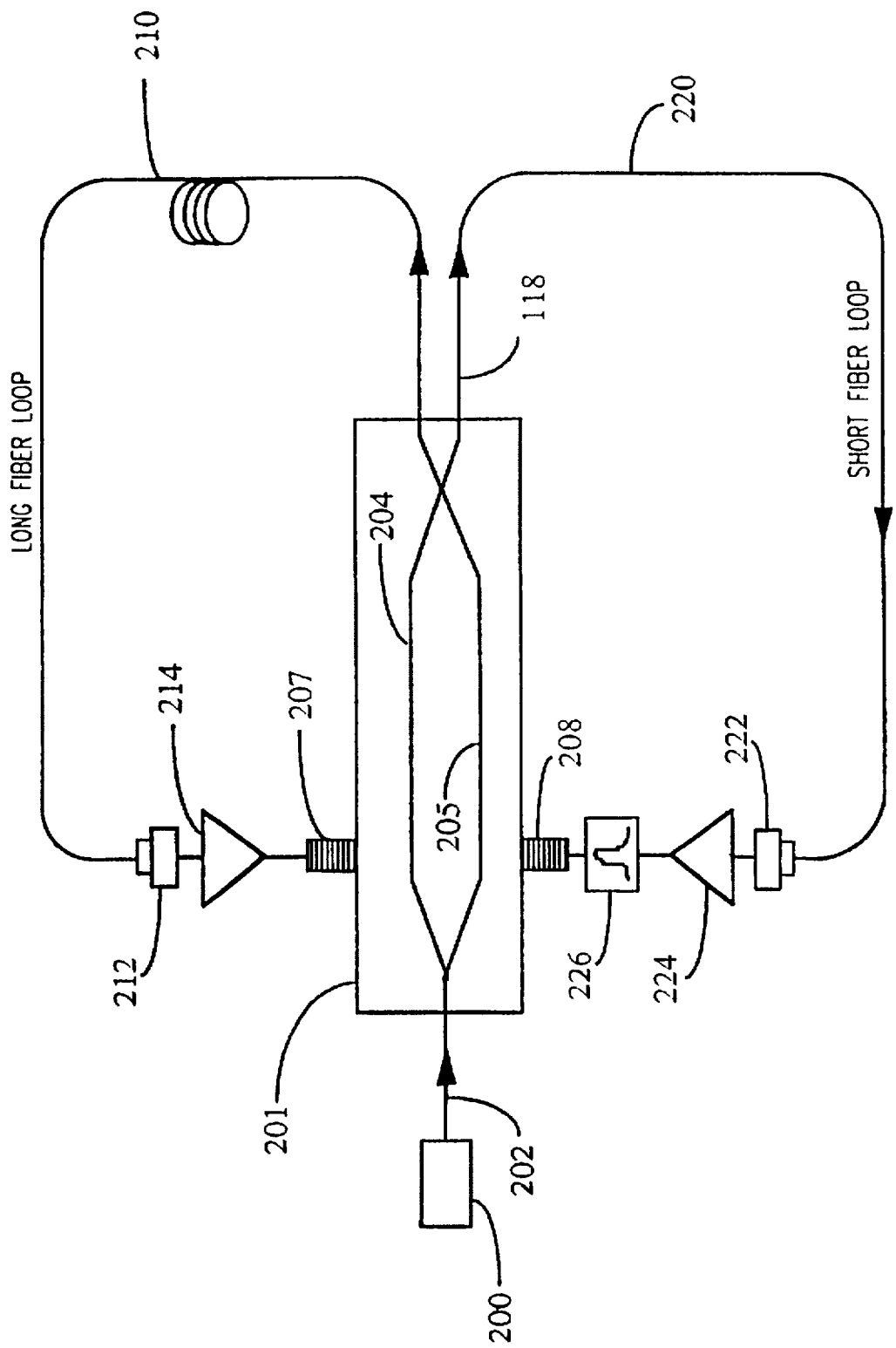
FIG. 2 shows a dual loop OEO which is a special case of a multiloop OEO disclosed in the present invention.

FIG. 2 shows one preferred embodiment of such a dual loop OEO that uses an E/O modulator. A light beam 202 produced by a pump light source 200 is coupled into two channels 204 and 205 in an E/O modulator 201 by an input coupler 203. The two channels 204 and 205 are phase modulated and then combined and further coupled into two fiber feedback loops 210 and 220 by an output coupler 206, respectively. A photodiode 212 in the first feedback loop 210 converts the light intensity into an electrical signal which is amplified by an amplifier 214. A RF driving port 207 couples the fiber loop 210 back to the E/O modulator 201. The second feedback loop 220 is similarly constructed with inclusion of a photodiode 222 and a RF amplifier 224. The two feedback loops 210 and 220 have different delay lengths and different oscillation modes. In general, the small signal loop gain and other loop characteristics are also different in the two feedback loops.

A single mode oscillation in a dual loop OEO occurs only when the two feedback loops are in resonance with each other, including overlap of modes of the two loops and the total loop gain of the two loops exceeding unity. The phases of the two loops are preferably locked relative to each other in order to sustain a single-mode oscillation and to tune the frequency of the oscillation.

The inventor of the present invention has successfully demonstrated the invention with prototype systems which will be disclosed hereinafter. To achieve a better understanding of the underlying principles of the invention, the inventor postulates a theoretical explanation of the invention in a simplified case of a dual feedback loop OEO. The concept of the dual loop theory can be expanded to further include other multiloop OEOs. The validity of the postulation should not be bounded to the embodiments and other variations of the present invention. A detailed account of the postulation is described as follows.

Figure 1:
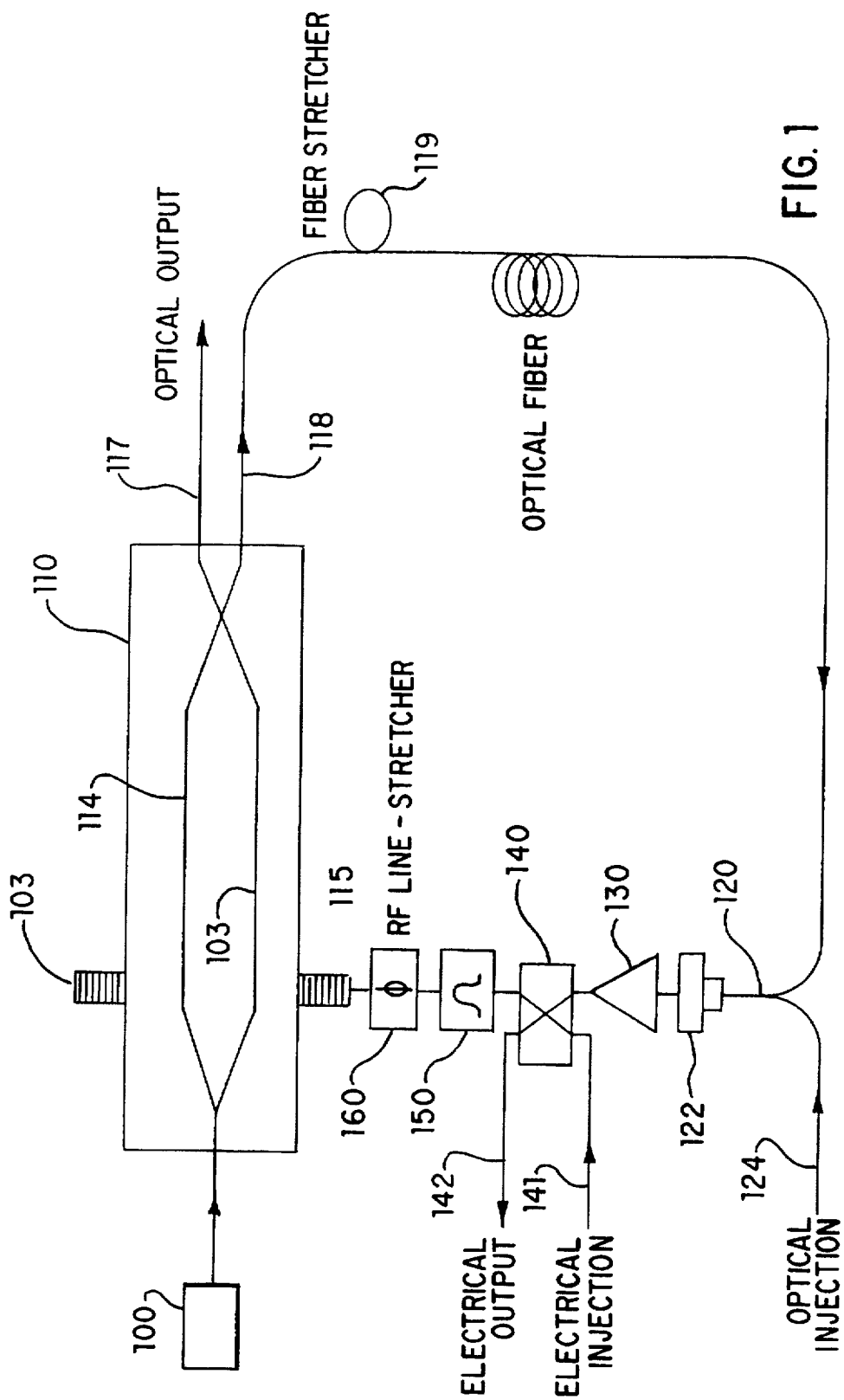
FIG. 1 is a schematic of a single-loop light induced microwave oscillator (OEO) disclosed in U.S. patent application Ser. No. 08/510,064.

For a single-loop OEO as shown in FIG. 1, a detailed description can be found in U.S. patent application Ser. No. 08/510,064. In particular, a quasi-linear theoretical model was developed to account for the oscillator dynamics and the noise in single-loop OEOs with inclusion of a RF filter in the closed feedback loop. The present theory for dual-loop OEO will adapt a similar quasi-linear approach.

It is assumed that the E/O modulator is a Mach-Zehnder type to simplify the discussion herein. This assumption by no means limits the generality of the theory. OEOs using other type of E/O modulators can be similarly analyzed. For an OEO of either single-loop or multiloop, the conditions for self sustained oscillations include coherent addition of partial waves each wave around the loop and a total loop gain exceeding losses for the circulation waves in the loop. For a single loop OEO, the possible oscillation frequencies are those that add up in phase after each round trip around the loop and that have a net round-trip gain larger than unity. Let $\tau$ be the total group delay time of the loop and $G(V_{OSC})$ be the total open loop voltage gain as a function of oscillation voltage amplitude $V_{osc}$, respectively. For the case that the gain $G(V_{osc})$ is negative, the possible oscillation frequencies are:

$$f_k = \left( k + \frac{1}{2} \right) \frac{1}{\tau} ,  \quad (1)$$

where k is an integer. If the gain is positive, the allowable oscillation frequencies are given by:

$$f_k = \frac{k}{\tau} . \quad (2)$$

In a dual loop OEO, there are two feedback loops of different lengths. The open loop gain of each loop is less than unity, however, the combined open loop gain of both loops is larger than unity. The possible oscillation frequencies must add up in phase after each round trip for both loops. For a negative gain $G(V_{osc})<0$, the allowable oscillation frequencies are:

$$f_{oso} = \left(k + \frac{1}{2}\right)\frac{1}{\tau_1} = \left(m + \frac{1}{2}\right)\frac{1}{\tau_2}, \quad (3)$$

where m is an integer, and $\tau_1$ and $\tau_2$ are the loop delays of loop 1 and loop 2, respectively. The allowable oscillation frequencies for a positive gain $G(V_{osc})>0$, are:

$$f_{osc} = \frac{k}{\tau_1} = \frac{m}{\tau_2}. \quad (4)$$

From Eq. (3) and Eq. (4) one can see that if loop 2 is n times shorter than loop 1, $$\tau_1 = n\tau_2, \quad (5)$$

then n must be an odd integer for $G(V_{osc})<0$ and an integer for the case $G(V_{OSC})>0$. The mode spacing $\Delta f$ is then dictated by the delay time of loop 2 with shorter delay length:

$$\Delta f = \frac{1}{\tau_2}. \quad (6)$$

Thus, a large mode spacing can be achieved by using one short loop in a multiloop OEO.

On the other hand, the phase noise of the oscillator is dictated by the longer loop which has larger cavity quality factor or Q-factor, resulting in an oscillator having large mode spacing and low phase noise.

The RF spectrum of the dual loop OEO may be analyzed using the same quasi-linear theory developed for the single-loop OEO. The recursive relation for the dual loop oscillator can be expressed as:

$$V_j(\omega) = (g_1 e^{i\omega\tau_1} + g_2 e^{i\omega\tau_2})V_{j-1}(\omega) \quad (7)$$

where $V_j(\omega)$ is the complex amplitude of the circulating field after a round trip, $g_1$ is the complex gain of loop 1 and $g_2$ is the complex gain of loop 2. The total field of all circulating fields is thus expressed as the following:

$$V_{out}(\omega) = \sum_{j=0}^{\infty} (g_1 e^{i\omega\tau_1} + g_2 e^{i\omega\tau_2})^j V_j(\omega) \frac{V_o}{1-(g_1 e^{i\omega\tau_1} + g_2 e^{i\omega\tau_2})}. \quad (8)$$

The corresponding RF power is, therefore, derived from Eq. (8):

$$P(\omega) = \frac{1}{2R}|V_{out}(\omega)|^2 \quad (9)$$

$$= \frac{|V_o|^2/2R}{1+|g_1|^2+|g_2|^2+2|g_1||g_2|\cos\Phi_{12}(\omega)-2|g_1|\cos\Phi_1(\omega)-2|g_2|\cos\Phi_2(\omega)}$$

where $$\Phi_i(\omega) = \omega\tau_i + \phi_i \quad (10)$$

$$\Phi_{12}(\omega) = \Phi_1(\omega) - \Phi_2(\omega). \quad (11)$$

In Eq. (10), $\phi_i$ is the phase factor of the complex gain $g_i$ (i=1, 2).

If the gain of each loop is less than unity, no oscillation may start independently in either loop. However, for the frequency components satisfying Eqs. (3) and (4), oscillation can start collectively in the two loops. When Eqs. (3) and (4) are satisfied, we have $$\Phi_1(\omega) = 2k\Pi, \quad (13)$$

$$\Phi_2(\omega) = 2m\Pi, \quad (12)$$

and $$\Phi_{12}(\omega) = \Phi_1(\omega) - \Phi_2(\omega) = 2(k-m)\Pi. \quad (14)$$

Substitution of Eqs. (12), (13), and (14) in Eq. (9) yields:

$$P(\omega) = \frac{|V_o|^2/2R}{1+|g_1|^2+|g_2|^2+2|g_1||g_2|-2|g_1|-2|g_2|}. \quad (15)$$

In order for the oscillation to start from noise, we must have:

$$1+|g_1|^2+|g_2|^2+2|g_1||g_2|-2|g_1|-2|g_2|=0 \quad (16)$$

If the complex loop gains have the same amplitude, the following is readily derived from Eq. (16):

$$|g_1|=|g_2|=0.5. \quad (17)$$

This is the oscillation threshold for the dual loop OEO. If initially the small signal gain in each loop is larger than 0.5, the nonlinearity of the E/O modulator or the amplifier will bring the gain to 0.5 after the oscillation is started and stabilized.

FIG. 3 shows the calculated frequency spectrum of the dual loop OEO from Eq. (9). In the calculation, we chose the following parameters:

$$\tau_1 = 0.1 \text{ } \mu s \quad (18)$$

$$\tau_2 = 10\tau_1 = 1 \text{ } \mu s, \quad (19)$$

$$|V_o|^2/2R = 1, \quad (20)$$

$$|g_1|=|g_2|=0.499999999. \quad (21)$$

Figure 3A:
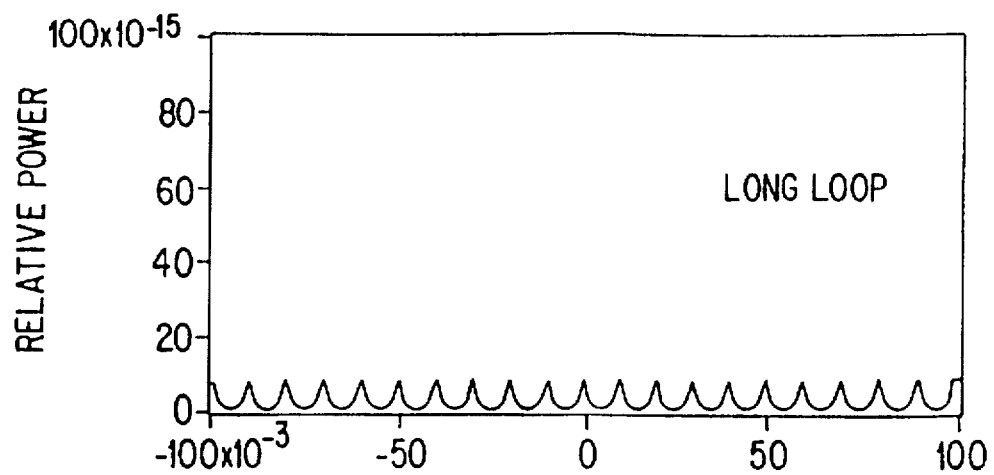
FIG. 3 includes FIGS. 3a, 3b, and 3c showing charts of calculated results based on a quasi-linear model for a dual loop OEO.
Figure 3B:
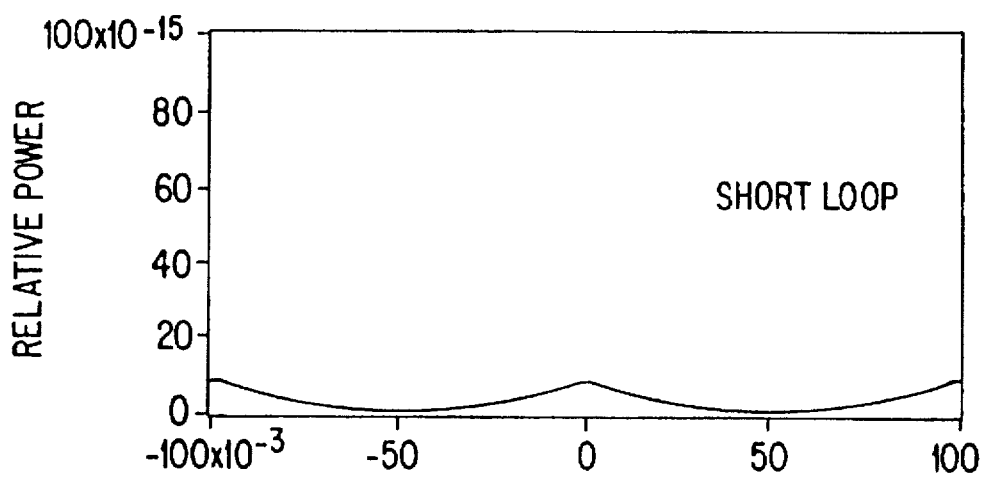
Figure 3C:
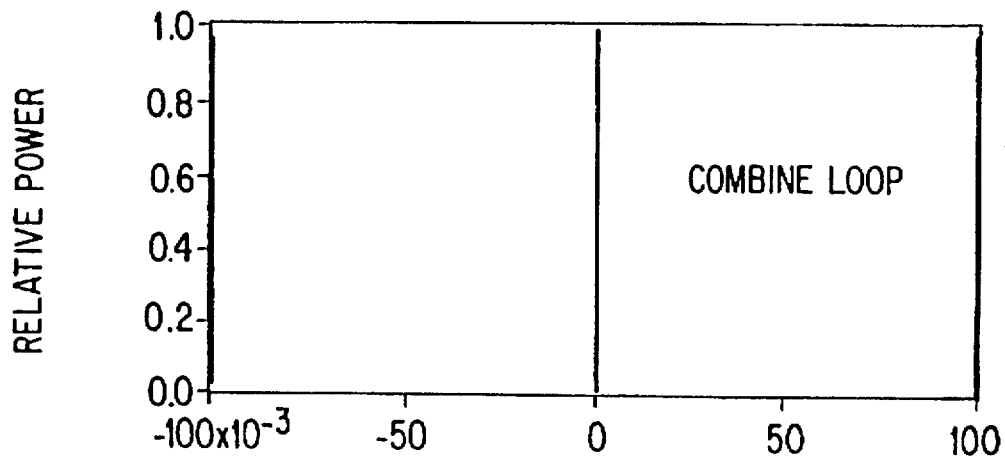

FIG. 3a shows the power spectrum when only the loop 2 with longer delay is in operation. FIG. 3b is the power spectrum of loop 1 of shorter delay alone in operation. FIG. 3c is the power spectrum of the OEO with both loops in operation. The relative power of the vertical axis in each graph is the calculated power of each case divided by the calculated peak power of the dual loop OEO. Note that the relative power for FIG. 3a and FIG. 3b are extremely low, due to the fact that the loop gain is too small for each loop to oscillate individually. For the dual loop case of the FIG. 2c, strong oscillation at selected frequencies is evident, with the mode spacing determined by loop 1 with shorter delay and spectral width of each resonance peak determined by loop 2 with longer delay. The existence of loop 2 of shorter delay suppresses modes of loop 1 of longer delay. Only the modes of loop 1 that are in synchronization with the modes of loop 2 in frequency domain will oscillate.

Single mode operation of the dual loop OEO can be achieved by including a RF filter of relative wide bandwidth in either loop. For example, a RF filter 226 can be inserted in the short loop for this purpose as shown in FIG. 2. A mode that is closest to the transmission peak of the RF filter 226 will be selected to oscillate and other modes will be suppressed.

Frequency tuning of the dual loop OEO is accomplished by tuning multiple devices including the RF filter 226, the short loop 220, the long loop 210, and the driving voltage signals for the E/O modulator 201. The two feedback loops are phase locked to each other. Any change in oscillation frequency in one loop is reflected in an equal change in another loop.

A change Δf in oscillation frequency f is proportional to a change ΔL in the corresponding loop length L, i.e., $$\frac{\Delta f}{f} = -\frac{\Delta L}{L}. \tag{22}$$

Therefore, a fine tuning in oscillation frequency of a dual loop OEO is done by changing the delay length of the long loop 210. This can be done in several ways including use of a RF line stretcher or a fiber stretcher in the long loop 210. A RF line stretcher can be inserted in the electrical portion of the long feedback loop 210. For example, it is connected between the RF amplifier 214 and the RF driving port 207 to change the delay of the loop 210. A fiber stretcher can be placed in the fiber portion of the long loop 210 to physically stretch the length of the fiber so that the delay of the fiber loop is changed.

The mid-range tuning is done with the short loop 220 with a tuning resolution of the mode spacing of the long loop 210. As with the fine tuning, a RF line stretcher or a fiber stretcher can be used for mid-range tuning. The continuous tuning range of the dual loop OEO is determined by the mode spacing of the short loop 220. For example, if the short loop 220 is 20 cm and the long loop 210 is 10 km, the tuning range will be 1 GHz and the tuning resolution with the short loop 220 will be 20 kHz.

For a even larger tuning range, a tunable RF filter can be used in either feedback loop. In addition, a biasing voltage to either RF driving ports 207 and 208 can be used for fine frequency tuning. All tuning devices must be synchronized to avoid mode hopping. The tuning of the RF filter and the short loop 220 is synchronized to avoid mode hopping of oscillation modes of the short loop 220 and the tuning of the short loop 220 and the long loop 210 is synchronized to avoid mode hopping of oscillation modes of the long loop 210. Additional devices can be implemented to eliminate mode hopping.

Other elements in the dual loop OEO may also affect the frequency characteristic and tunability of the system including spectral characteristic of the E/O modulator and photodetector. The combination of the dual loop OEO and the tunable RF filter produces a novel frequency synthesizer with wide frequency tuning range (tens of GHz), low phase noise, and high frequency resolution.

The E/O modulator 201 is preferably of the well-known Mach-Zehnder type that modulates light intensity by phase modulation. Other types of modulators can also be used in accordance with the present invention, including but not limited to, electro-absorption modulator (e.g., a quantum-well) modulator, a directional coupler modulator, a polarization modulator, and an acoustic-optic modulator.

Various implementations of the present invention are described in the rest of this disclosure. These implementations were built to demonstrate the functionability and capability of the invention. The performance of these systems is highly dependent on the particular components and devices that were available at the time of test. One skilled in the art in which the present invention pertains should understand that the particularities of the components and devices used in the prototype systems and the tested results do not limit the content and scope of the invention but rather provide a demonstration of the invention.

Figure 4:
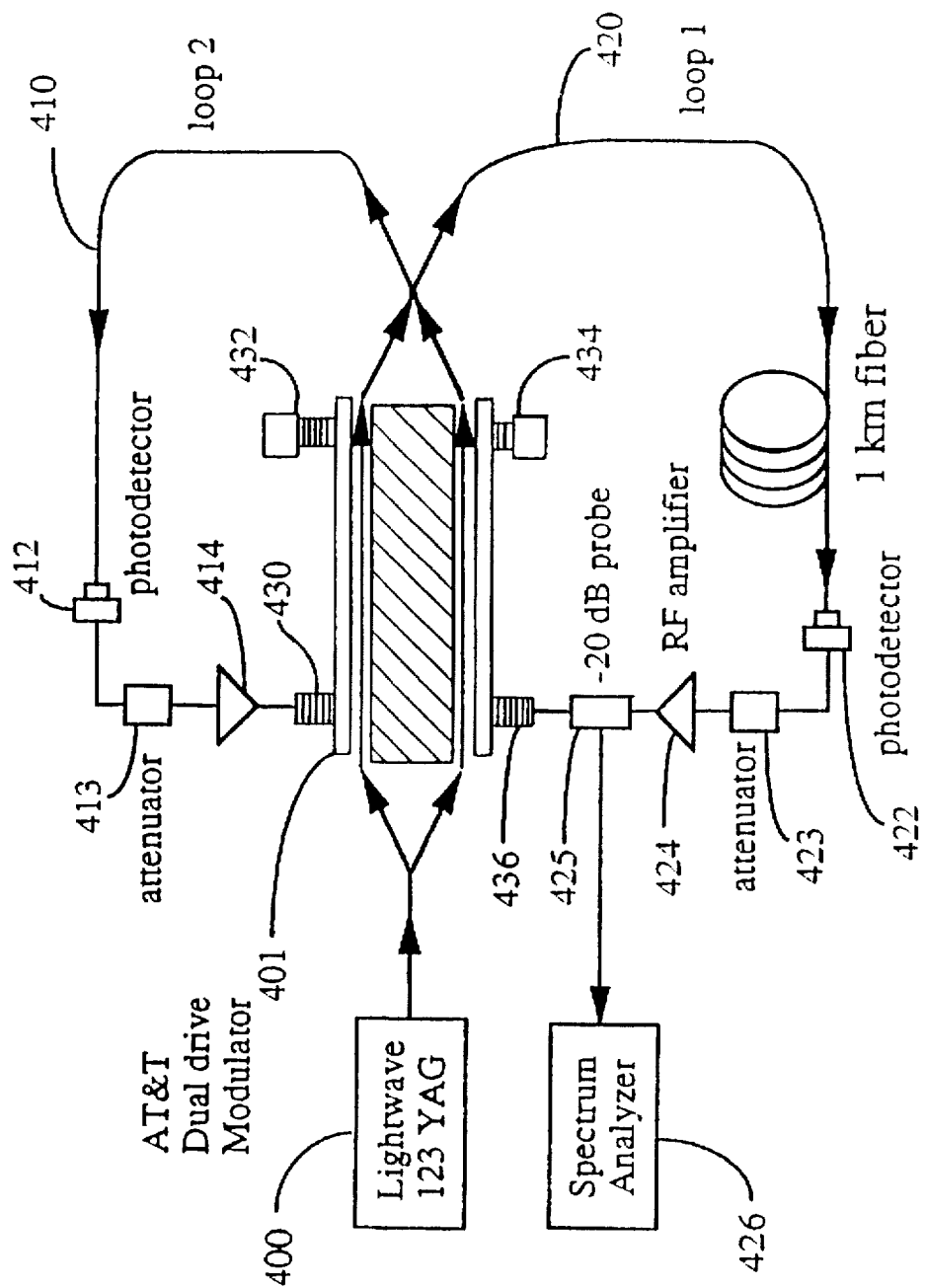
FIG. 4 shows an experimental setup for a dual loop OEO tested by the present inventor.

FIG. 4 is an experimental setup of a dual loop OEO similar to the system shown in FIG. 2. The pump light source 400 was a single-mode diode-pumped YAG laser at 1.32 μm by Lightwave Electronics (Lightwave 123 YAG). A dual drive electro-optic modulator 401 made by AT&T was used. The shorter loop 410 includes a photodetector 412 from Hughes Research Lab, a 7 dB attenuator 413, and an RF amplifier 414 by Avantek (AFT-12634). The longer loop 420 includes a Lasertron photodetector 422, a 6 dB attenuator 423, and Celeritek amplifier 424 (CSA-903396). The attenuators in the feedback loops are used to adjust the gain in each loop. The fiber in the long loop 420 is about 1 Km long and the fiber in the short loop 410 is a few meters long, respectively. A spectrum analyzer 525 is connected to a 20 dB probe at the output port of the RF amplifier 424 in the short loop 420. This allows measurements of the power spectrum of the dual loop OEO. The E/O modulator 401 has two RF input ports 430 and 436 and two RF output ports 432 and 434. The two output ports 432 and 434 are terminated to minimize reflective interference. As described previously, frequency tuning can be implemented in the dual loop OEO of FIG. 4 with a broadband RF filter, RF line stretchers or fiber stretchers.

Figure 5A:
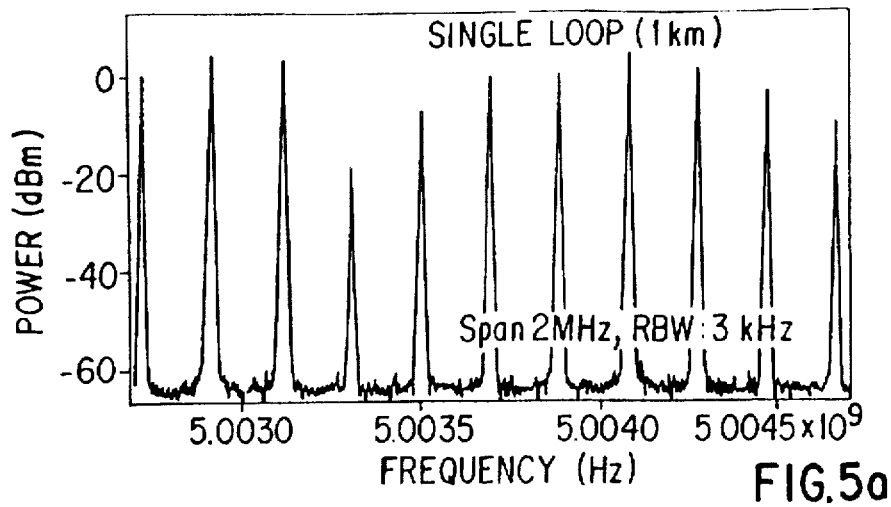
FIGS. 5a, 5b, and 5c are charts showing the measurements performed with the setup of FIG. 4.
Figure 5B:
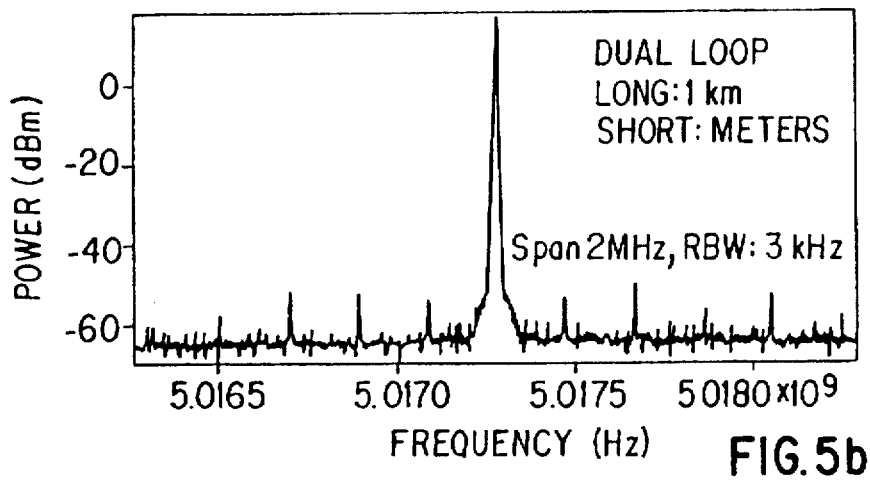
Figure 5C:
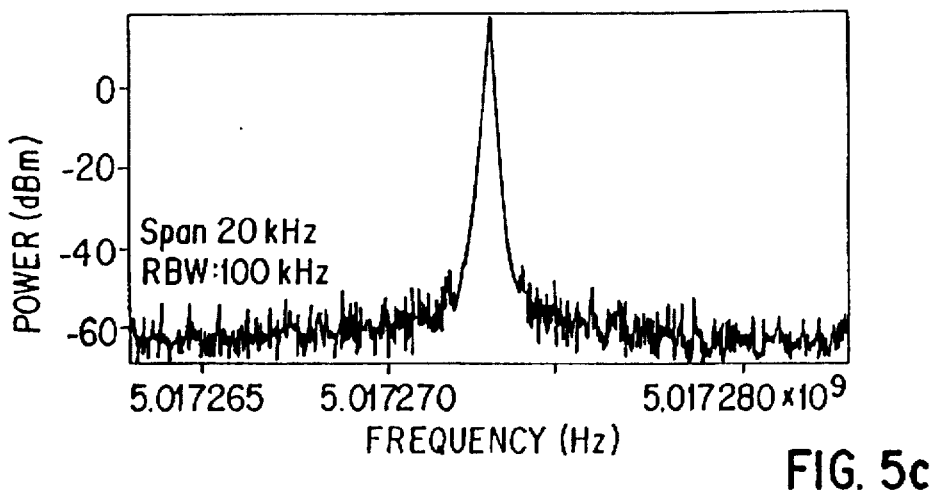

FIG. 5 shows the measurements of the power spectrum of the system in FIG. 4. FIG. 5a shows the multimode oscillation of a single loop OEO in which the shorter loop 410 is disconnected, however the longer loop 420 is closed and its open loop gain is larger than unity. FIG. 5b shows the single mode oscillation of a dual loop OEO in which both loops 410 and 420 were closed and the gain of each loop was adjusted by inserting attenuators of proper values so that they were just below the oscillation threshold in each loop. However, the combined loop gain for a particular oscillation mode was larger than unity and the oscillation thereof is established in the system. It is evident from FIG. 5b that the presence of the shorter loop 410 effectively selects one mode of the longer loop 420 to oscillate and suppresses other modes thereof. The mode suppression ratio was measured to be more than 60 dB. FIG. 5c shows the spectral profile of a resonance peak of the single mode oscillation of the dual loop OEO. The frequency span and the resolution bandwidth of each figure are labeled.

Notably, an additional advantage of the dual loop configuration in FIG. 4 is that, at a fixed optical pump power, the second loop increases the open loop gain by 6 dB and hence reduces the oscillation threshold by 6 dB. This is because that the RF signals from both loops are used to modulate both optical channels 204 and 205 of the E/O modulator.

Figure 6A:
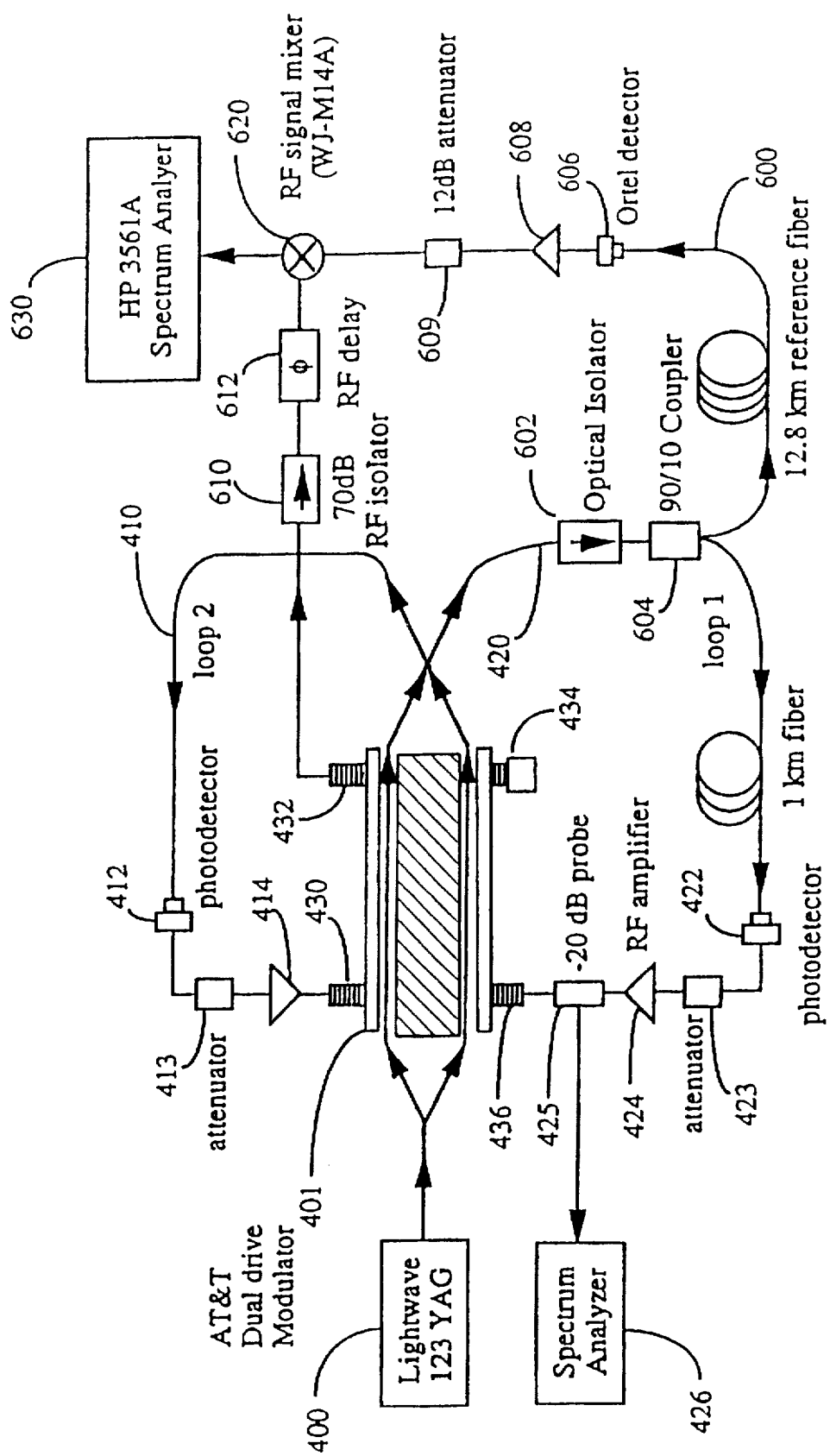
FIG. 6a shows an experimental setup for measuring the phase noise in a dual loop OEO.
Figure 6B:
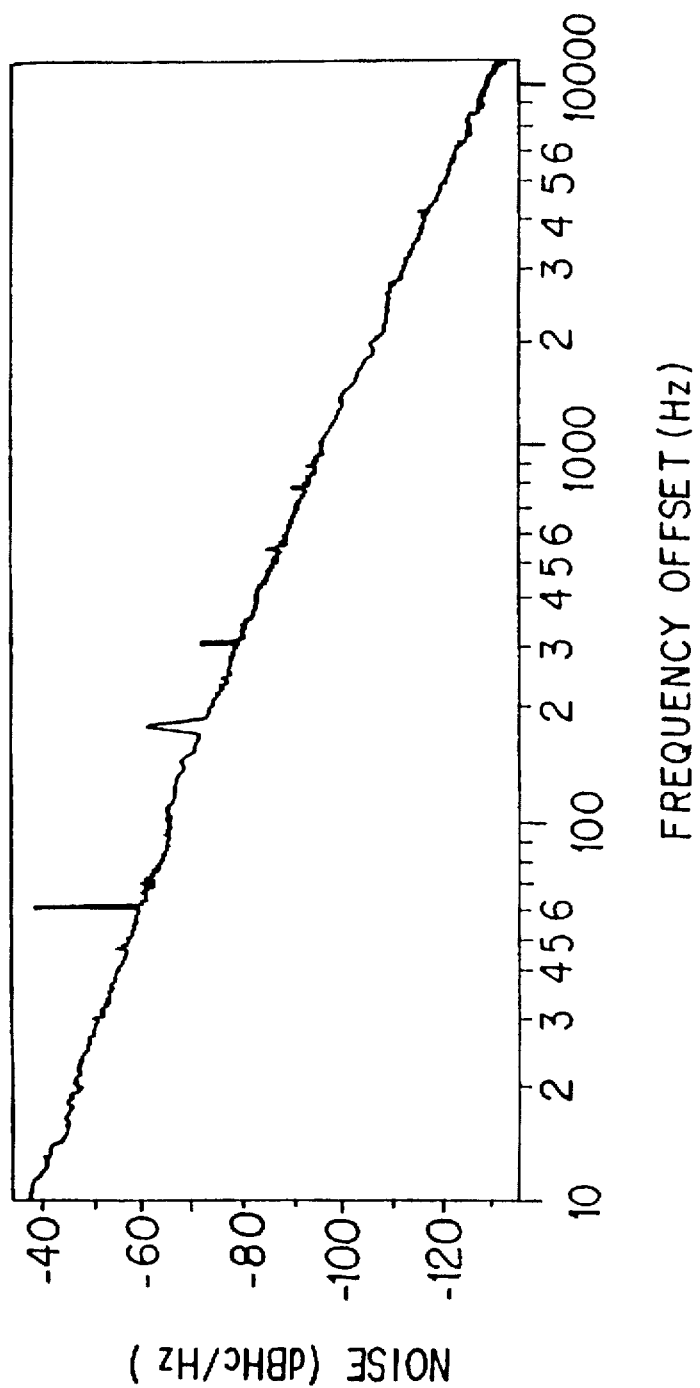

The inventor also devised an experiment to measure the phase noise of the dual loop OEO with a frequency discriminator method. The experimental setup is shown in FIG. 6a. Two additional RF channels were used to form the two interference channels for the measurements. A reference fiber 600 of about 12.8 km long couples about a small fraction of the optical energy from the long loop 420 (e.g., 10%) by a fiber coupler 604. An optical isolator 602 was used to minimize any optical feedback. The optical signal from the reference fiber 600 was converted into a RF signal by a photodetector 606 and sent to a RF signal combiner 620 via a RF amplifier 608 and a RF attenuator 609. The second RF channel is obtained by using the RF signal from the output port 432. A RF isolator 610 with 70 dB of power attenuation was used to minimize any feedback to the E/O modulator 401. The two RF signals were mixed at the RF signal mixer 620 and the combined signal was measured by a spectrum analyzer 630. Both the loop fiber and the reference fiber are acoustically isolated in a box padded with lead-backed foam. Spectrum analyzer 426 was used to monitor the RF oscillation in the dual loop OEO. FIG. 6b shows the measured phase noise as a function of the offset frequency. It should be noticed that at 10 kHz from the carrier (about 5 GHz), the phase noise of the dual loop OEO is '132 dBc/Hz, more than 10 dB lower than the phase noise of a best quartz oscillator multiplied to 5 GHz.

Figure 7:
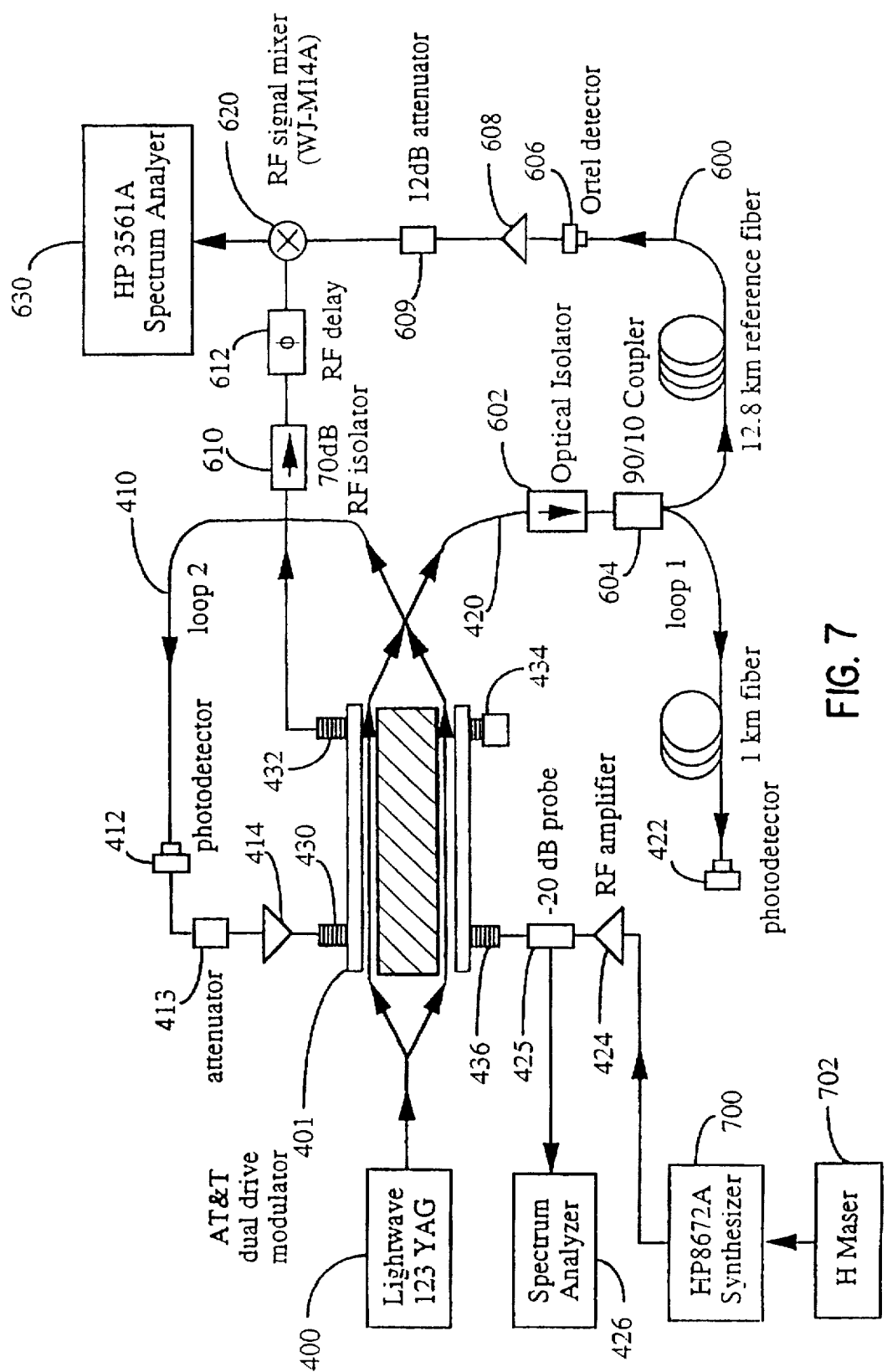
FIG. 7 shows the experimental setup for measuring the phase noise in a high performance HP frequency synthesizer in comparison with a dual loop OEO.

As a comparison, the inventor also measured the phase noise of a high performance HP frequency synthesizer HP8672A using the same frequency discriminator method. The experimental setup is shown in FIG. 7. The long fiber loop 420 of FIG. 6a is replaced with the HP frequency synthesizer (HP8672A) 700 that is locked to a hydrogen maser 702 for long-term stability. The RF signal and the feedback RF signal from the short fiber loop 410 modulated the two optical channels, respectively. The spectrum analyzer 630 was used to measure phase noise with a frequency discriminator technique. The measurements show that the synthesizer's phase noise at 10 kHz away from the 5 GHz carrier is −97 dBC/Hz which is more than 30 dB higher than that of the dual loop OEO in FIG. 6a. The fact that this phase noise level is consistent with the data supplied by the manufacturer confirms the validity of the experiment setup.

Various configurations of multiloop OEO are contemplated by the inventor. Five examples of such dual loop OEO are shown in FIG. 8. The dual feedback loops can be both optical, or one electrical and another one optical. FIG. 8a shows a dual loop OEO with dual optical fiber loops. The optical signals in both fiber loops are converted into RF signals by two photodiodes 222. Next the RF signals of the two loops are coupled together by a RF coupler 800. The coupled RF signal is fed back to the E/O modulator 201. FIG. 8b shows a dual loop OEO using dual optical feedback loops that implements an optical output 802. The optical output 802 is from one optical output channel of the E/O modulator 201. The other optical output channel 804 is split into two fiber loops 210 and 220 by an optical coupler 803. FIG. 8c shows a simpler dual loop OEO having an optical output 802. An electrical RF output can be easily implemented in these embodiments by using a RF coupler in either loop, e.g., between the RF amplifier 224 and the RF input port 208. The RF coupler can also be used for electrical RF injection. Similarly, an optical fiber coupler can be used in either fiber loop to implement an optical output or optical injection.

FIGS. 8d and 8e show "hybrid" dual loop OEOs that use one optical feedback loop and one electrical feedback loop. One optical output channel 802 of the E/O modulator 201 is used as the optical output and the other channel is used to form the optical fiber loop as the first feedback loop. The second feedback loop is an electrical loop which is formed by sending a portion of the electrical feedback signal to the driving port 208 of the E/O modulator 201 to an electrical delay line 810. In FIG. 8d, the RF signal from the electrical delay line 810 is coupled with the RF signal from the long optical fiber loop 210 using a RF coupler 800. The coupled RF signal from the RF coupler 800 is then fed back to the E/O modulator 201. In FIG. 8e, the RF signal from the electrical delay line 810 is directly sent to one RF driving port 812 of the E/O modulator 201 for modulating one optical path 820. The RF signal from the long optical loop 210 is sent to another RF driving port 208 for modulating another optical path 830. The electrical and optical feedback loops interact with each other at the optical output coupler 840 in the E/O modulator 201. As mentioned earlier, electrical RF output/injection and optical output/injection can be implemented with a RF coupler and optical fiber coupler, respectively. Frequency tuning can be done with a broadband RF filter, RF line stretchers or fiber stretchers.

Figure 9:
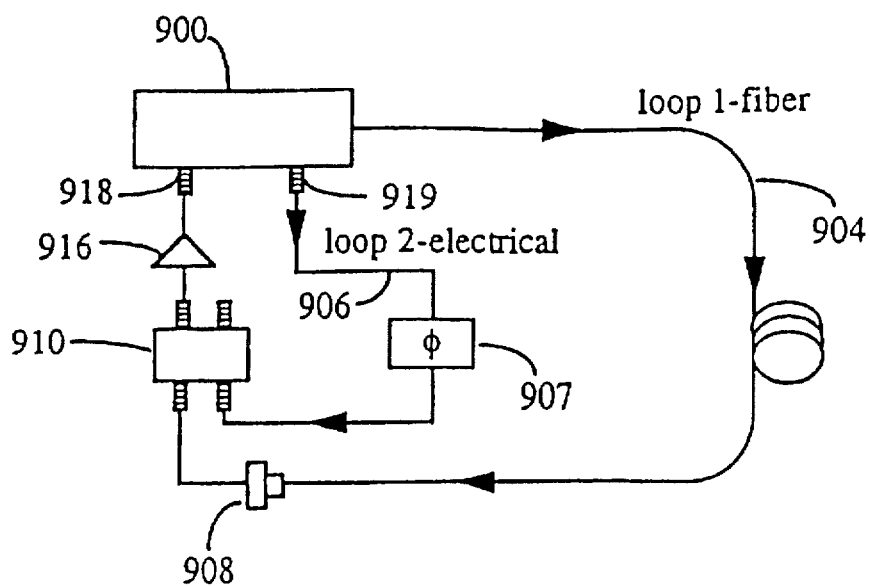
FIG. 9 shows one embodiment of dual loop OEO using direct feedback to the driving light source.

Other types of multiloop OEOs are contemplated by the inventor. In the previous embodiments of the present invention, an E/O modulator is the main component for implementing light modulation and signal feedback. One alternative way is to directly send the feedback signals to the pump light source and modulate the output intensity thereof. FIG. 9 illustrates one embodiment of the such multiloop OEO in a dual loop configuration. An optical coupler 902 couples the output beam from a light source 900 into a long fiber loop 904. A photodiode 908 converts the optical signal into electrical signal. A short delay loop is formed by an electrical delay line 906. A portion of the RF feedback signal to the driving port 918 is sent to an electrical output port 919. A RF combiner 910 couples the RF signals from the two loops together. The coupled RF signal is fed to the light source 900 to modulate the driving current thereof and thereby to modulate the output light intensity.

Figure 10:
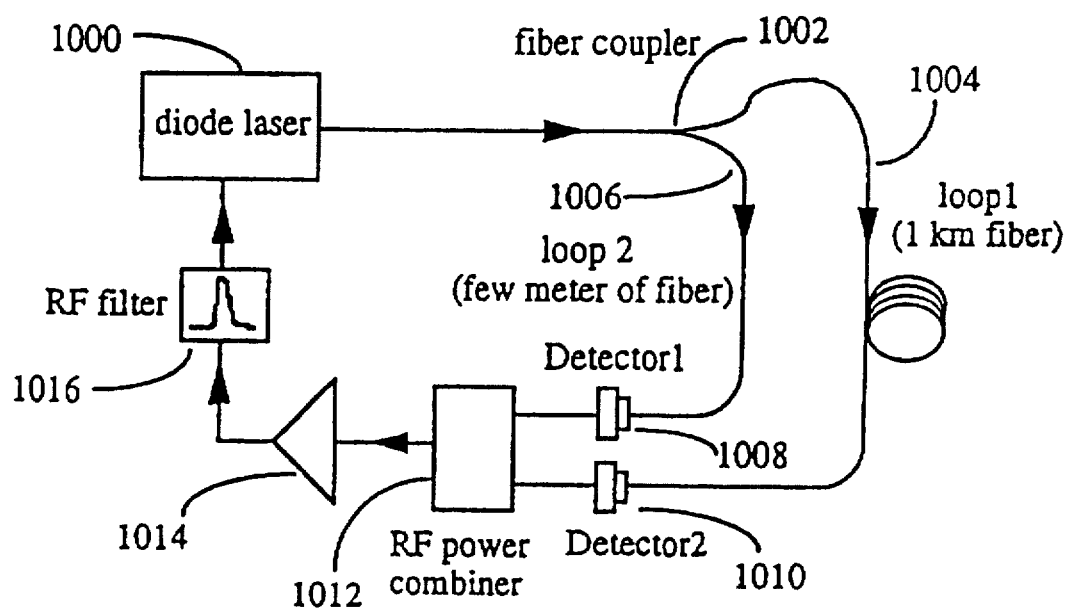
FIG. 10 shows another embodiment of dual loop OEO using direct feedback to the driving light source.
Figure 11A:
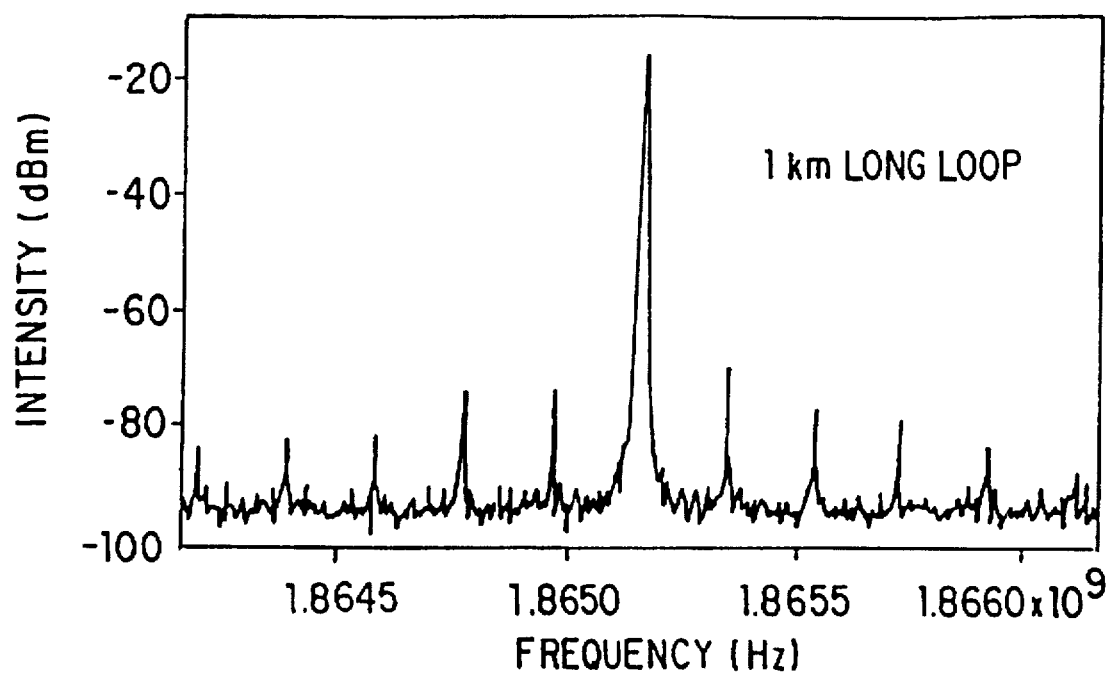
FIG. 11 includes FIGS. 11a and 11b which show the spectral measurements of the driving laser in a system as shown in FIG. 10.
Figure 11B:
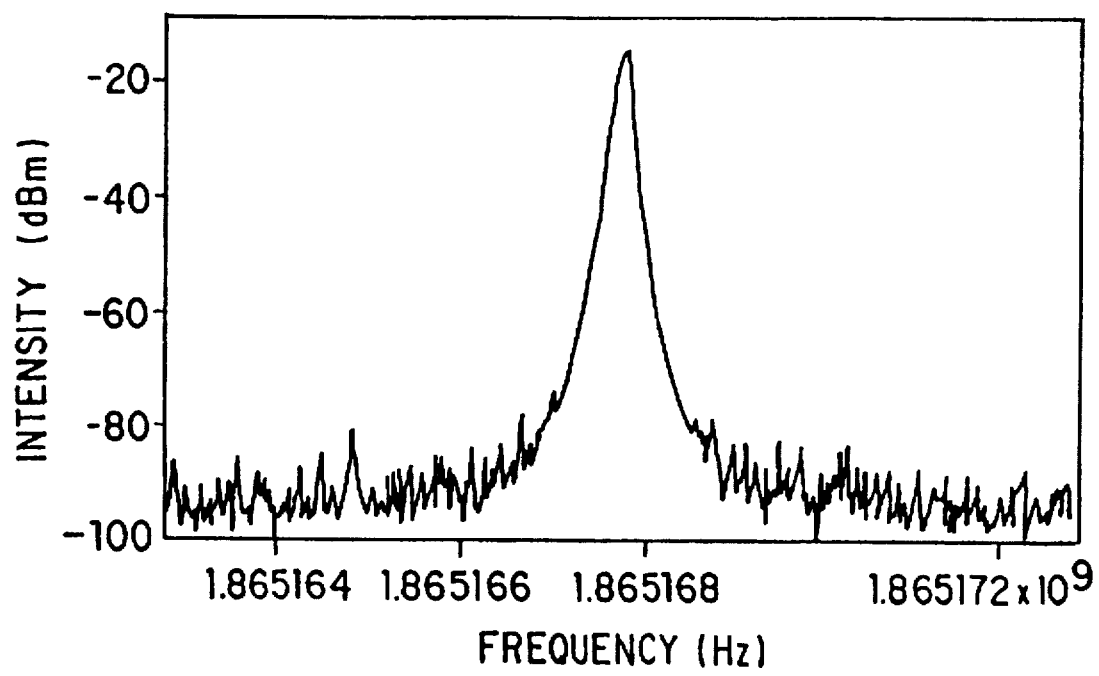

Another embodiment of a directly modulated dual loop OEO is shown in FIG. 10. A single-mode distributed feedback (DFB) diode laser 1000 is used as the pump laser. A fiber coupler 1002 couples the output laser beam into a long fiber loop 1004 and a short fiber loop 1006. Two photodetectors 1008 and 1010 converts optical signals into electrical signals. A RF power combiner 1012 couples the RF signals from the two fiber loops together. The combined RF signal is amplified by a RF amplifier 1014, filtered by a RF narrow band filter 1016, and fed to the DFB laser 1000. The inventor successfully demonstrated a dual loop OEO as shown in FIG. 10. The fiber coupler 1002 was a 50/50 coupler. The long loop 1004 was 1 km and the short loop 1006 was a few meters, respectively. The spectral measurements of the DFB laser are shown in FIG. 11. The measurements were taken at the output of the amplifier 1041. FIG. 11a shows the power spectrum of the DFB laser 1000 with a display frequency span of 2 MHz and a resolution bandwidth of 3 KHz. It is evident again that a great modal suppression was achieved using the dual loop technique of the present invention. FIG. 11b shows the spectral detail of the oscillating mode 1110 with a display frequency span of 10 KHz and a resolution bandwidth of 100 Hz.

Achieving oscillation without use of an amplifier in the loop is beneficial because it further reduces the system noise by eliminating 1/f noise and white noise introduced by an amplifier. In addition, this eliminates the power consumed by the amplifier and thus reduces the total power consumption of the system. One unique aspect of the multiloop OEO in the present invention is that it is easier to achieve oscillation without power amplification than a single loop OEO. As stated previously, the requirement for oscillation is that the total open-loop gain of the system exceeds one. Therefore, the open-loop gain in each of the multiple loops can be smaller than one while the oscillation still sustains in the multiloop OEO. This reduces the minimum power requirement in the signal in each feedback loop for achieving oscillation in the overall system. For an optical loop in the multiloop OEO, this reduces the required input optical power and the power handling capability of the photodiode therein. In operation, a minimum optical input power into the multiple optical feedback loops is required in order to sustain an oscillation without power amplification. The inventor of the present invention has demonstrated oscillation without power amplification in a dual loop OEO using two optical fiber loops.

The present invention as described in various embodiments employs at least one optical fiber feedback loop in a multiloop OEO configuration to achieve a continuously tunable RF oscillation. A system in accordance with the present invention has significant advantages over many other oscillators, in particular, in terms of versatility of its applications and in frequency tunability. In comparison with a single-loop OEO, the multiloop OEO of the present invention significantly reduces the phase noise by implementing at least one long fiber feedback loop. The multiloop OEO has wider frequency tunability and narrower spectral linewidth than that of the single-loop OEO. Furthermore, the multiloop OEO is more flexible and versatile than the single-loop OEO in that electrical feedback loop can be implemented in additional to external electrical injection.

Although the present invention has been described in detail with reference to a number of particular embodiments, one ordinarily skilled in the art to which this invention pertains will appreciate that various modifications and enhancements may be made without departing from the spirit and scope of the present invention.

For example, although all the embodiments disclosed hereabove are dual loop oscillators, the principles can be used to construct an OEO with more than two loops as clearly stated earlier. In particular, more feedback loops may further improve the performance of the dual loop OEO including narrower spectral width and better frequency tunability.

The frequency characteristics of the multiloop OEO can be modified by changing the delay times with variable optical delay devices and/or variable electrical delay devices. One example of variable optical delay devices is a fiber stretcher which changes the length of a fiber to change the delay time. A RF line stretcher is an example for variable electrical delay devices.

Electrical signal couplers and optical couplers can be used in the multiloop system to generate electrical and optical signal outputs or to inject external electrical and optical signals into the system. This allows the present invention to be implemented in a wide range of applications.

Figure 12B:
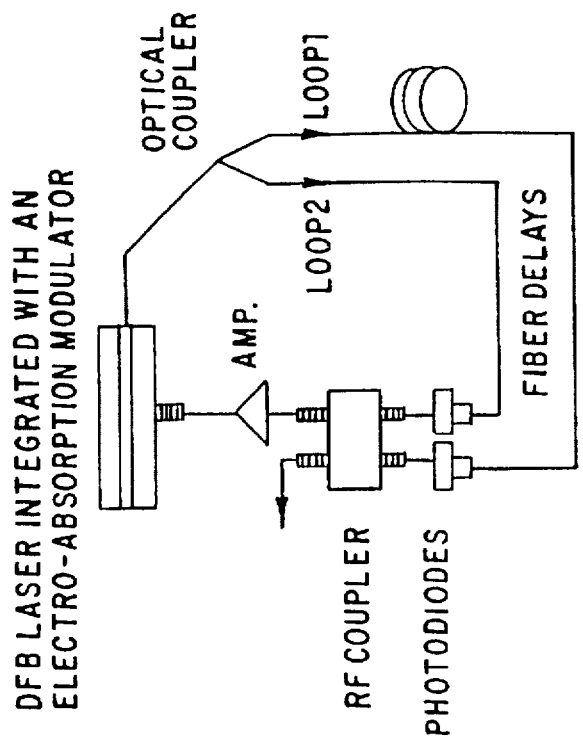
FIG. 12 includes FIGS. 12a, 12b, 12c, and 12d, showing examples of various modulation schemes for a multiloop OEO in accordance with the present invention.
Figure 12A:
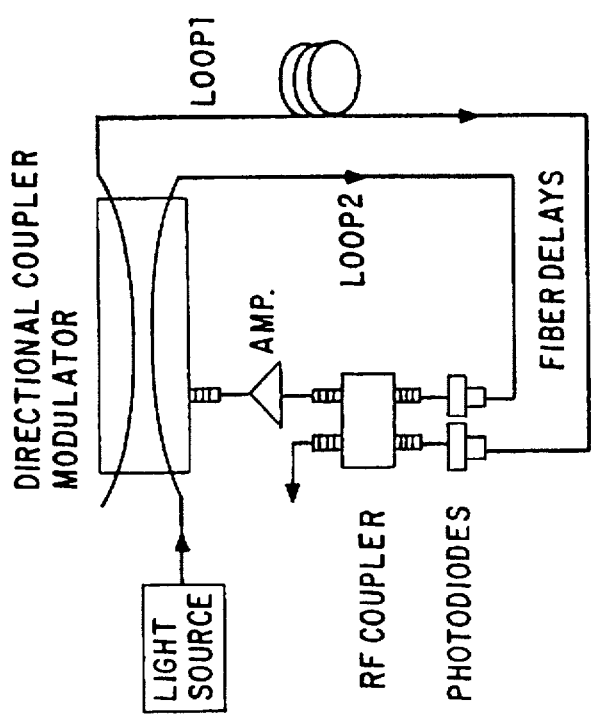
Figure 12D:
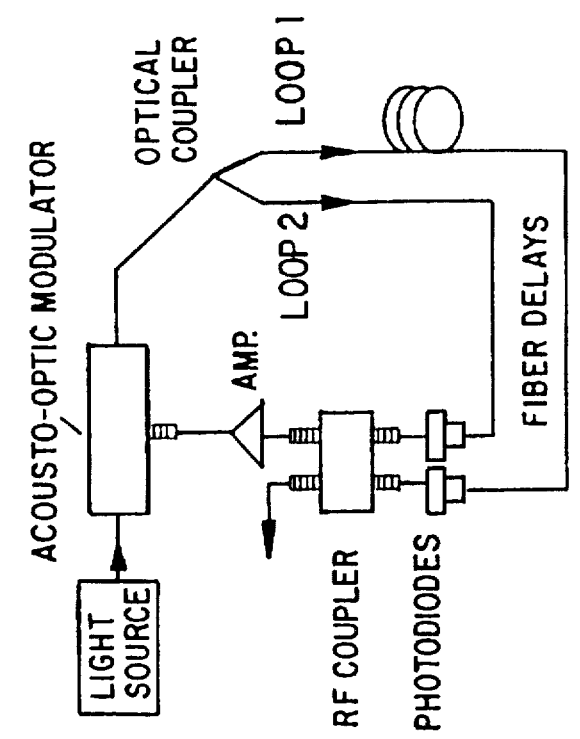
Figure 12C:
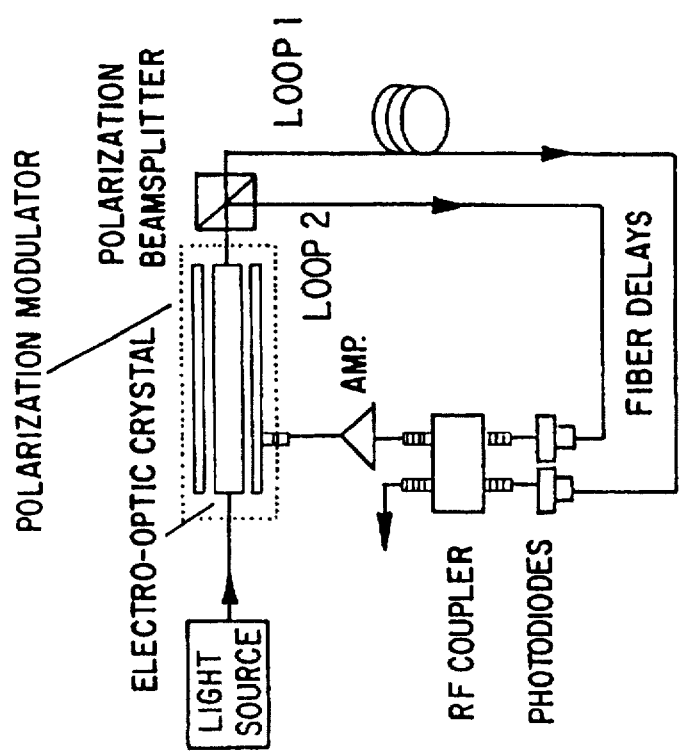

In addition, other optical delay methods other than optical fibers as used in the preferred embodiments can be used in accordance with the present invention. A variety of light sources can be used in accordance with the present invention such as light-emitting diodes (LEDs), LED arrays, diode lasers, diode laser arrays, diode laser pumped solid-state lasers including diode-pumped fiber lasers. Furthermore, many modulation schemes can be used in a multiloop OEO in accordance with the present invention. FIG. 12 depicts some examples of dual loop OEOs using different optical modulators, such as a directional coupler modulator (FIG. 12a), a DFB laser integrated with an electro-absorption modulator (FIG. 12b), a polarization modulator (FIG. 12c), and an acousto-optic modulator (FIG. 12d).

All these and other modifications are intended to be encompassed within the following claims, in which:

What is claimed is:

1. An opto-electronic system, comprising:
an electro-optical modulator having an electrical input port and an optical output port, operating to generate an optical signal that is modulated at an oscillating frequency related to an electrical driving signal from said electrical input port;
a first feedback loop, operating to receive a first portion of said optical signal and to produce a first electrical feedback signal to said electrical input port with a first amount of delay and a first positive feedback; and
a second feedback loop, operating to receive a second portion of said optical signal and to produce a second electrical feedback signal to said electrical input port with a second amount of delay and second positive feedback,
wherein said first electrical feedback signal and said second electrical feedback signal cooperatively affect said electrical driving signal and said first and second feedback loops have a total open loop gain greater than unity.

2. A system as in claim 1, further including a light source disposed relative to said electro-optical modulator and configured to produce light, said electro-optical modulator receiving and modulating said light to generate said optical signal.

3. A system as in claim 2, wherein said light source includes a laser or a light-emitting diode.

4. A system as in claim 3, wherein said light source includes a diode laser, or a diode-pumped solid-state laser.

5. A system as in claim 4, wherein said diode-pumped solid-state laser is a diode-pumped YAG laser.

6. A system as in claim 1, wherein said electro-optical modulator further includes an electrical bias port, operating to receive an electrical biasing signal; said electrical biasing signal affecting operation of said electro-optical modulator and thereby changing said oscillating frequency in said opto-electronic system.

7. A system as in claim 1, further comprising:
a first photodetector in said first feedback loop, operating to convert said first portion of said optical signal into said first electrical feedback signal; and
a second photodetector in said second feedback loop, operating to convert said second portion of said optical signal into said second electrical feedback signal.

8. A system as in claim 7, wherein said first feedback loop further includes a first optical fiber therein to transport said first portion of said optical signal to said first photodetector.

9. A system as in claim 7, further comprising:
an electrical signal combiner, operating to combine said first electrical feedback signal and said second electrical feedback signal to produce a third electrical feedback signal; and
said third electrical feedback signal being sent to said electrical input port of said electro-optical modulator to affect said electrical driving signal thereof.

10. A system as in claim 7, further including an electrical signal amplifier, operating to receive and amplify an electrical feedback signal in said system.

11. A system as in claim 9, further including an electrical signal filter, operating to affect spectral characteristic of said third electrical feedback signal and thereby to affect spectral characteristic of said optical signal produced by said electro-optical modulator.

12. A system as in claim 8, further including a first variable optical delay device in said first optical fiber in said first feedback loop, operating to change length of said first optical fiber and thereby to change said first amount of delay of said first feedback loop.

13. A system as in claim 9, further including a variable electrical signal delay device, operating to add an amount of delay to said third electrical feedback signal.

14. A system as in claim 13 wherein said variable electrical signal delay device is a RF line-stretcher.

15. A system as in claim 9, further including a variable electrical signal delay device in said first feedback loop which is connected between said first photodetector and said electrical signal combiner and is configured to add an additional delay to said first amount of delay of said first feedback loop.

16. A system as in claim 9, further including a variable electrical signal delay device in said second feedback loop which is connected between said second photodetector and said electrical signal combiner and is configured to add an additional delay to said second amount of delay of said second feedback loop.

17. A system as in claim 8 wherein said second feedback loop includes a second optical fiber to transport said second portion of said optical signal to said second photodetector.

18. A system as in claim 17 further including a second variable optical delay device in said second optical fiber in said second feedback loop, operating to change said second amount of delay of said second feedback loop.

19. A system as in claim 1, wherein said first amount of delay in said first feedback loop is substantially larger than said second amount of delay in said second feedback loop.

20. A system as in claim 1, further including an optical coupler, operating to generate an optical output signal, and to inject an external optical signal into said system.

21. A system as in claim 1, further including an electrical signal coupler, operating to generate an electrical output signal, and to inject an external electrical signal into said system.

22. A system as in claim 1, further including a third feedback loop, operating to receive a third portion of said optical signal and to produce an additional electrical feedback signal to said electrical input port with an amount of delay.

23. A system as in claim 1, wherein said electro-optical modulator is configured to perform light intensity modulation.

24. A system as in claim 1, wherein said electro-optical modulator is an electro-absorption modulator.

25. A system as in claim 1, wherein said electro-optical modulator is selected from a group consisting of a directional coupler modulator, a light modulator using light polarization, and an acousto-optic modulator.

26. An opto-electronic system operating to generate electromagnetic oscillations, comprising:

an electro-optical modulator having an electrical input port, an optical output port, and an electrical output port, operating to generate an optical signal that is modulated at an oscillating frequency related to an electrical driving signal from said electrical input port;

a first optical feedback loop, operating to receive said optical signal and to produce a first electrical feedback signal to said electrical input port with a first amount of delay and a first positive feedback; and a second electrical feedback loop, operating to receive an electrical modulation signal related to said electrical driving signal from said electrical output port and to produce a second electrical feedback signal to said electrical input port with a second amount of delay and a second positive feedback, wherein said first electrical feedback signal and said second electrical feedback signal operate collectively to affect said electrical driving signal and said first and second feedback loops have a total open loop gain greater than unity.

27. A system as in claim 26 further including a photodetector in said first optical feedback loop, operating to convert said optical signal into said first electrical feedback signal.

28. A system as in claim 27, wherein said first optical feedback loop further includes an optical fiber therein to transport said optical signal to said photodetector.

29. A system as in claim 26, further comprising:

an electrical signal combiner, operating to combine said first electrical feedback signal and said second electrical feedback signal to produce a third electrical feedback signal; and said third electrical feedback signal being sent to said electrical input port of said electro-optical modulator to affect said electrical driving signal thereof.

30. A system as in claim 26, further including an electrical signal amplifier, operating to receive and amplify an electrical feedback signal in said system.

31. A system as in claim 29, further including an electrical signal filter, operating to affect spectral characteristic of said third electrical feedback signal and thereby to affect spectral characteristic of said optical signal produced by said electro-optical modulator.

32. A system as in claim 26, further including a variable optical delay device, operating to change said first amount of delay of said first optical feedback loop.

33. A system as in claim 29, further including a first variable electrical signal delay device, connecting between said electrical signal combiner and said electrical input port and operating to add a third amount of delay to said third electrical feedback signal.

34. A system as in claim 33 wherein said variable electrical signal delay device is a RF line-stretcher.

35. A system as in claim 33, further including a second variable electrical signal delay device in said first optical feedback loop, connecting between said photodetector and said electrical signal combiner and operating to add an additional delay to said first amount of delay of said first optical feedback loop.

36. A system as in claim 33, further including a third variable electrical signal delay device in said second electrical feedback loop, connecting between said electrical output port and said electrical signal combiner and operating to add an additional delay to said second amount of delay of said second electrical feedback loop.

37. A system as in claim 30, further including an electrical signal coupler connected between said photodetector and said electrical signal combiner in said first optical feedback loop, operating to partition a portion of said first electrical feedback signal as an electrical output signal, and/or to inject an external electrical signal into said first electrical feedback signal.

38. A system as in claim 30, further including an electrical signal coupler in said second electrical feedback loop, operating to partition a portion of said second electrical feedback signal as an electrical output signal, and/or to inject an external electrical signal into said second electrical feedback signal.

39. A system as in claim 30, further including an electrical signal coupler connected between said electrical signal combiner and said electrical input port, operating to partition a portion of said third electrical feedback signal as an electrical output signal, and/or to inject an external electrical signal into said third electrical feedback signal.

40. A system as in claim 30, wherein said first amount of delay in said first optical feedback loop is substantially larger than said second amount of delay in said second electrical feedback loop.

41. An opto-electronic system for generating electromagnetic oscillations, comprising:

a light source having an electrical input port, operating to produce light that is modulated at an oscillating frequency related to an electrical driving signal applied at said electrical input port;

a first feedback loop, operating to receive a first portion of said optical signal and to produce a first electrical feedback signal to said electrical input port with a first amount of delay and a first positive feedback; and a second feedback loop, operating to receive a second portion of said optical signal and to produce a second electrical feedback signal to said electrical input port with a second amount of delay and a second positive feedback.

wherein said first electrical feedback signal and said second electrical feedback signal operate collectively to affect said electrical driving signal and said first and second feedback loops have a total open loop gain greater than unity.

42. A system as in claim 41, wherein said light source is a laser or a light-emitting diode.

43. A system as in claim 42, wherein said laser is a diode laser, or a diode-pumped solid-state laser.

44. A system as in claim 43, wherein said laser is a distributed feedback diode laser.

45. A system as in claim 44, further comprising:

a first photodetector in said first feedback loop, operating to convert said first portion of said optical signal into said first electrical feedback signal; and a second photodetector in said second feedback loop, operating to convert said second portion of said optical signal into said second electrical feedback signal.

46. A system as in claim 45, wherein said first feedback loop further includes a first optical fiber therein to transport said first portion of said optical signal to said first photodetector.

47. A system as in claim 41, further comprising:

an electrical signal combiner, operating to combine said first electrical feedback signal and said second electrical feedback signal to produce a third electrical feedback signal; and said third electrical feedback signal being sent to said electrical input port of said light source to affect said electrical driving signal.

48. A system as in claim 41, further including an electrical signal amplifier, operating to receive and amplify an electrical signal in said system.

49. A system as in claim 47, further including an electrical signal filter, operating to affect spectral characteristic of said third electrical feedback signal and thereby to affect said oscillating frequency.

50. A system as in claim 41, further including a first variable optical delay device, operating to change said first amount of delay of said first feedback loop.

51. A photonic method for generating radio frequency signals, comprising:

modulating light at an oscillating frequency with a controlling signal wherein said oscillating frequency has a relationship with said controlling signal;

partitioning a portion of said light to produce a first feedback signal with a first amount of delay;

using an optical delay element to produce at least a part of said first amount of delay;

producing a second feedback signal with a second amount of delay by using one of said light and said controlling signal;

changing said controlling signal with both said first feedback signal and said second feedback signal to further modulate said light; and thereby generating radio frequency oscillations in said controlling signal and in said light.

52. A method as in claim 51, further including:

making said first feedback signal have a certain relationship with said second feedback signal.

53. A method as in claim 52, wherein said certain relationship is a phase relationship.

54. A method as in claim 51, further including making said first amount of delay substantially larger than said second amount of delay.

55. A method as in claim 54, wherein said optical delay element is an optical fiber.

56. A method as in claim 55, further including:

partitioning another portion of said light to produce said second feedback signal; and using another optical delay element to produce at least a part of said second amount of delay.

57. A method as in claim 56, wherein said another optical delay element is another optical fiber.

58. A method as in claim 55, further including:

taking a portion of controlling signal to produce said second feedback signal; and using an electrical signal delay element to produce at least a part of said second amount of delay.

59. A method as in claim 52, further including amplifying said first feedback signal and said second feedback signal and making a total open-loop gain of said first feedback signal and said second feedback signal exceed unity.

60. An opto-electrical system for generating electromagnetic oscillation, comprising:

a light source having an electrical input port, operating to produce light that is modulated at an oscillating frequency related to an electrical driving signal applied at said electrical input port;

a first feedback loop, operating to receive said optical signal and to produce a first electrical feedback signal to said electrical input port with a first amount of delay; and a second feedback loop, operating to receive an electrical modulation signal related to said electrical driving signal and to produce a second electrical feedback signal to said electrical input port with a second amount of delay, wherein first electrical feedback signal and said second electrical feedback signal operate collectively to affect said electrical driving signal.

61. A system as in claim 60, wherein said light source is a laser or a light-emitting diode.

62. A system as in claim 61, wherein said laser is a diode laser, or a diode-pumped solid-state laser.

63. A system as in claim 62, wherein said laser is a distributed feedback diode laser.

64. A system as in claim 60, further comprising a photodetector in said first feedback loop, operating to convert said optical signal into said first electrical feedback signal.

65. A system as in claim 64, wherein said first feedback loop further includes a first optical fiber therein to transport said optical signal to said photodetector.

66. A system as in claim 60, further comprising:

an electrical signal combiner, operating to combine said first electrical feedback signal and said second electrical feedback signal to produce a third electrical feedback signal; and said third electrical feedback signal being sent to said electrical input port of said light source to affect said electrical driving signal.

67. A system as in claim 66, further including an electrical signal amplifier, operating to receive and amplify an electrical signal in said system.

68. A system as in claim 66, further including an electrical signal filter, operating to affect spectral characteristic of said third electrical feedback signal and thereby to affect said oscillating frequency.

69. A system as in claim 68, further including a variable optical delay device, operating to change said first amount of delay of said first feedback loop.

70. A system as in claim 65 further including a variable optical delay device which is a fiber stretcher and is operable to change said first amount of delay.

71. A system as in claim 7, wherein said first feedback loop has a first open-loop gain that is less than unity and said second feedback loop has a second open-loop gain that is less than unity, wherein said system is operable to sustain said electromagnetic oscillation in absence of a signal amplification device therein.

72. A system as in claim 45, wherein said first feedback loop has a first open-loop gain that is less than unity and said second feedback loop has a second open-loop gain that is less than unity, wherein said system is operable to sustain said electromagnetic oscillation in absence of a signal amplification device therein.

73. A method as in claim 51, further including:
making said first feedback signal have a first open-loop gain to be smaller than one;
making said second feedback signal have a second open-loop gain to be smaller than one;
making a total open-loop gain be greater than one; and
thereby sustaining an oscillation in said controlling signal and said light.

74. An opto-electronic system, comprising:
an electro-optical modulator having an electrical input port and an optical output port, operating to generate an optical signal that is modulated at an oscillating frequency related to an electrical driving signal from said electrical input port;
a first feedback loop, operating to receive a first portion of said optical signal and to produce a first electrical feedback signal to said electrical input port with a first amount of delay;
a first photodetector disposed in said first feedback loop and configured to convert said first portion of said optical signal into said first electrical feedback signal;
a second feedback loop, operating to receive a second portion of said optical signal and to produce a second electrical feedback signal to said electrical input port with a second amount of delay; and
a second photodetector disposed in said second feedback loop and configured to convert said second portion of said optical signal into said second electrical feedback signal,
wherein said first electrical feedback signal and said second electrical feedback signal cooperatively affect said electrical driving signal.

75. A system as in claim 74, further comprising an optical delay element disposed in at least one of said first and second feedback loops and configured to cause a phase delay.

76. A system as in claim 74, further comprising an electrical signal delay element disposed in at least one of said first and second feedback loops and configured to cause a phase delay.

77. A system as in claim 74, wherein said first and second feedback loops have different loop oscillation modes with different mode spacings and modes in said first feedback loop overlap modes in said second feedback loop in frequency domain.

78. An opto-electronic system for generating electromagnetic oscillations, comprising:
a light source having an electrical input port, operating to produce light that is modulated at an oscillating frequency related to an electrical driving signal applied at said electrical input port;
a first feedback loop, operating to receive a first portion of said optical signal and to produce a first electrical feedback signal to said electrical input port with a first amount of delay;
a first photodetector disposed in said first feedback loop and configured to convert said first portion of said optical signal into said first electrical feedback signal;
a second feedback loop, operating to receive a second portion of said optical signal and to produce a second electrical feedback signal to said electrical input port with a second amount of delay; and
a second photodetector disposed in said second feedback loop and configured to convert said second portion of said optical signal into said second electrical feedback signal,
wherein said first electrical feedback signal and said second electrical feedback signal operate collectively to affect said electrical driving signal.

79. A system as in claim 78, further comprising an optical delay element disposed in at least one of said first and second feedback loops and configured to cause a phase delay.

80. A system as in claim 78, further comprising an electrical signal delay element disposed in at least one of said first and second feedback loops and configured to cause a phase delay.

81. A system as in claim 78, wherein said first and second feedback loops have different loop oscillation modes with different mode spacings and modes in said first feedback loop overlap modes in said second feedback loop in frequency domain.

82. A method for generating radio frequency signals, comprising:
modulating light at an oscillating frequency with a controlling signal wherein said oscillating frequency has a relationship with said controlling signal;
producing a first positive electrical feedback signal with a first amount of delay by using one of said light and said controlling signal in a first way;
producing a second positive electrical feedback signal with a second amount of delay by using one of said light and said controlling signal in a second way;
changing said controlling signal by using both said first electrical feedback signal and said second electrical feedback signal to further modulate said light;
maintaining a total open-loop gain of said first and said second electrical feedback signals greater than unity; and
thereby generating radio frequency oscillations in said controlling signal and in said light.

83. A method as in claim 82, further comprising making said first electrical feedback signal have a certain phase relationship with said second electrical feedback signal.

84. A system as in claim 1, wherein said first and second feedback loops have different loop oscillation modes with different mode spacings and modes in said first feedback loop overlap modes in said second feedback loop in frequency domain.

85. A system as in claim 26, wherein said first and second feedback loops have different loop oscillation modes with different mode spacings and modes in said first feedback loop overlap modes in said second feedback loop in frequency domain.

86. A system as in claim 41, wherein said first and second feedback loops have different loop oscillation modes with different mode spacings and modes in said first feedback loop overlap modes in said second feedback loop in frequency domain.

87. A system as in claim 60, wherein said first and second feedback loops have different loop oscillation modes with different mode spacings and modes in said first feedback loop overlap modes in said second feedback loop in frequency domain.

* * * * *